(12) United States Patent
Hong et al.

(10) Patent No.: US 12,310,106 B2
(45) Date of Patent: May 20, 2025

(54) DEVICES INCLUDING STACKED NANOSHEET TRANSISTORS

(71) Applicant: Samsung Electronics Co., Ltd., Suwon-si (KR)

(72) Inventors: Byounghak Hong, Albany, NY (US); Seunghyun Song, Albany, NY (US); Ki-Il Kim, Clifton Park, NY (US); Gunho Jo, Clifton Park, NY (US); Kang-Ill Seo, Springfield, VA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/499,258

(22) Filed: Nov. 1, 2023

(65) Prior Publication Data

US 2024/0072060 A1 Feb. 29, 2024

Related U.S. Application Data

(62) Division of application No. 17/380,999, filed on Jul. 20, 2021, now Pat. No. 11,843,001.

(60) Provisional application No. 63/188,501, filed on May 14, 2021.

(51) Int. Cl.
| | | |
|---|---|---|
| H01L 27/12 | (2006.01) | |
| H01L 21/822 | (2006.01) | |
| H01L 21/8234 | (2006.01) | |
| H01L 21/84 | (2006.01) | |
| H01L 27/088 | (2006.01) | |
| H10D 84/01 | (2025.01) | |
| H10D 84/03 | (2025.01) | |
| H10D 84/83 | (2025.01) | |
| H10D 86/00 | (2025.01) | |
| H10D 86/01 | (2025.01) | |
| H10D 88/00 | (2025.01) | |

(52) U.S. Cl.
CPC ....... *H10D 86/201* (2025.01); *H10D 84/0128* (2025.01); *H10D 84/0142* (2025.01); *H10D 84/038* (2025.01); *H10D 84/83* (2025.01); *H10D 86/01* (2025.01); *H10D 88/01* (2025.01)

(58) Field of Classification Search
CPC ................. H01L 21/8221; H01L 29/0673
See application file for complete search history.

(56) References Cited

U.S. PATENT DOCUMENTS

| | | |
|---|---|---|
| 9,929,214 B2 | 3/2018 | Apodaca et al. |
| 10,297,664 B2 | 5/2019 | Xie |
| 10,347,719 B2 | 7/2019 | Cheng et al. |
| 10,658,481 B1 | 5/2020 | Zhang et al. |

(Continued)

OTHER PUBLICATIONS

Extended European Search Report Corresponding to European Application No. 22173196.1 (12 pages) (Sep. 15, 2022).

*Primary Examiner* — John A Bodnar
(74) *Attorney, Agent, or Firm* — Myers Bigel, P.A.

(57) ABSTRACT

Nanosheet transistor devices are provided. A nanosheet transistor device includes a transistor stack that includes a lower nanosheet transistor having a first nanosheet width and a lower gate width. The transistor stack also includes an upper nanosheet transistor that is on the lower nanosheet transistor and that has a second nanosheet width and an upper gate width that are different from the first nanosheet width and the lower gate width, respectively. Related methods of forming a nanosheet transistor device are also provided.

8 Claims, 23 Drawing Sheets

(56) References Cited

U.S. PATENT DOCUMENTS

| | | |
|---|---|---|
| 10,741,456 B2 | 8/2020 | Cheng et al. |
| 10,784,171 B2 | 9/2020 | Frougier et al. |
| 10,879,308 B1 | 12/2020 | Ando et al. |
| 10,991,711 B2 | 4/2021 | Reznicek et al. |
| 2010/0176460 A1 | 7/2010 | Goto |
| 2019/0172751 A1 | 6/2019 | Smith et al. |
| 2019/0312104 A1 | 10/2019 | Cheng et al. |
| 2019/0393214 A1 | 12/2019 | Lilak et al. |
| 2020/0006356 A1 | 1/2020 | Ando et al. |
| 2020/0035569 A1 | 1/2020 | Frougier et al. |
| 2020/0075574 A1 | 3/2020 | Smith et al. |
| 2020/0098756 A1 | 3/2020 | Lilak et al. |
| 2020/0098859 A1* | 3/2020 | Reboh ............... H01L 29/42392 |
| 2020/0105751 A1 | 4/2020 | Dewey et al. |
| 2020/0105891 A1 | 4/2020 | Lilak et al. |
| 2020/0135735 A1 | 4/2020 | Sengupta et al. |
| 2020/0203341 A1 | 6/2020 | Barraud et al. |
| 2020/0294866 A1 | 9/2020 | Cheng et al. |
| 2020/0365464 A1 | 11/2020 | Sreenivasan et al. |
| 2021/0005604 A1 | 1/2021 | Ge et al. |
| 2021/0013107 A1 | 1/2021 | Gardner et al. |
| 2021/0013111 A1 | 1/2021 | Smith et al. |
| 2021/0036122 A1 | 2/2021 | Wong et al. |
| 2022/0013521 A1 | 1/2022 | Zhang et al. |
| 2022/0109046 A1 | 4/2022 | Hong et al. |

\* cited by examiner

DEVICES INCLUDING STACKED NANOSHEET TRANSISTORS

CLAIM OF PRIORITY

This application is a divisional of U.S. patent application Ser. No. 17/380,999, filed Jul. 20, 2021, which claims the benefit of U.S. Provisional Patent Application Ser. No. 63/188,501, filed on May 14, 2021, entitled Devices Including Trigate Stepped Nanosheet, the disclosures of all of which are hereby incorporated herein in their entireties by reference.

FIELD

The present disclosure generally relates to the field of semiconductor devices and, more particularly, to nanosheet transistor devices.

BACKGROUND

The density of transistors in electronic devices has continued to increase. Though three-dimensional transistor structures can help to increase transistor density, they may experience electrical vulnerabilities, such as parasitic capacitance. For example, parasitic capacitance between a contact metal and a gate metal of a three-dimensional transistor structure can reduce device performance.

SUMMARY

A nanosheet transistor device, according to some embodiments herein, may include a transistor stack that includes a lower tri-gate nanosheet transistor having a first nanosheet width and an upper tri-gate nanosheet transistor on the lower tri-gate nanosheet transistor. The upper tri-gate nanosheet transistor may have a second nanosheet width that is different from the first nanosheet width.

A nanosheet transistor device, according to some embodiments, may include a transistor stack. The transistor stack may include a lower nanosheet transistor having a first nanosheet width and a lower gate width. Moreover, the transistor stack may include an upper nanosheet transistor on the lower nanosheet transistor. The upper nanosheet transistor may have a second nanosheet width and an upper gate width that are different from the first nanosheet width and the lower gate width, respectively.

A method of forming a nanosheet transistor device, according to some embodiments, may include forming a preliminary transistor stack comprising a first plurality of nanosheets and a second plurality of nanosheets on the first plurality of nanosheets. The method may include forming a recess in the preliminary transistor stack by removing a first portion of the second plurality of nanosheets. The method may include forming a spacer in the recess. Moreover, the spacer may overlap the first plurality of nanosheets and contact a second portion of the second plurality of nanosheets that remains after removing the first portion.

DETAILED DESCRIPTION

Pursuant to embodiments of the present invention, nanosheet transistor devices comprising a transistor stack are provided. A transistor stack includes a lower transistor and an upper transistor that vertically overlaps the lower transistor and that may share a gate electrode with the lower transistor. Though stepped nanosheet ("sNS") structures, which have different upper and lower nanosheet widths, have been proposed, a gate metal of an sNS structure may have parasitic capacitance with an adjacent contact metal. Specifically, the capacitance may increase with increased width of the gate on the stepped portion of the sNS structure. According to embodiments of the present invention, however, parasitic capacitance between an sNS gate and a source/drain contact can be reduced by removing a portion of the gate electrode material that is closest to the source/drain contact.

Example embodiments of the present invention will be described in greater detail with reference to the attached figures.

Figure 1A:
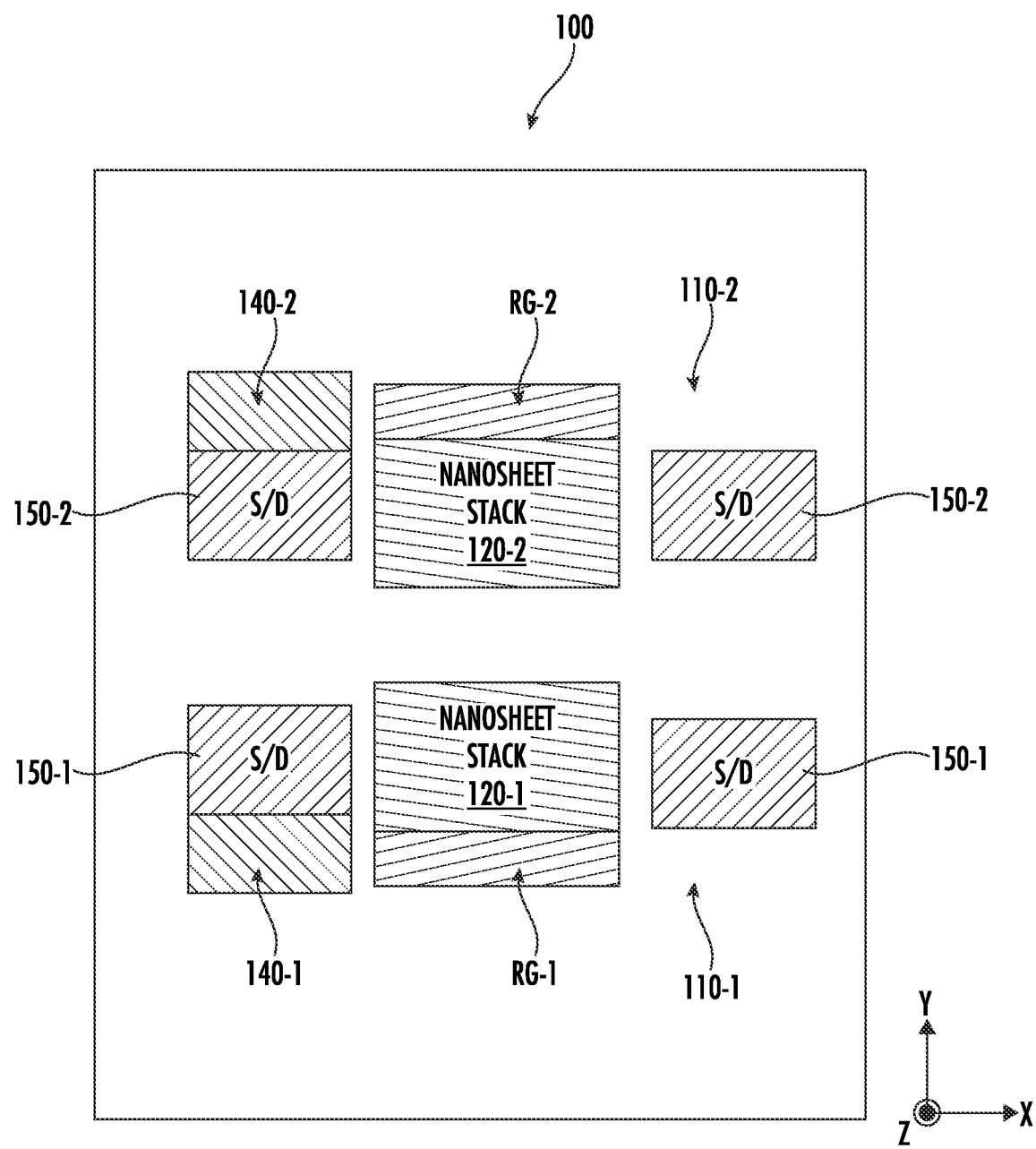
FIG. 1A is a plan view of a nanosheet transistor device according to some embodiments of the present invention.

FIG. 1A is a plan view of a nanosheet transistor device 100 according to some embodiments of the present invention. The device 100 includes first and second transistor stacks 110-1, 110-2. For simplicity of illustration, only two transistor stacks 110 are shown in FIG. 1A. In some embodiments, however, the device 100 may include three, four, or more transistor stacks 110. For example, the two transistor stacks 110-1, 110-2 may be a pair of transistor stacks 110 that are closer to each other than to any other transistor stack 110 in the device 100.

The first transistor stack 110-1 includes a first nanosheet stack 120-1 that is between a pair of source/drain regions 150-1 in a first horizontal direction X. The first nanosheet stack 120-1 includes nanosheets NS (FIG. 1B) and a gate G (FIG. 1B) that is on the nanosheets NS. Though the nanosheets NS may contact the source/drain regions 150-1, the gate G may be spaced apart from the source drain regions 150-1 in the direction X.

A source/drain contact 140-1, which may comprise metal, is adjacent one of the source/drain regions 150-1 in a second horizontal direction Y, which may be perpendicular to the direction X. For example, the source/drain contact 140-1 may be a drain contact.

To reduce parasitic capacitance with the source/drain contact 140-1, a region RG-1 of the nanosheet stack 120-1 that is adjacent (e.g., aligned/overlapping in the direction X with) the source/drain contact 140-1 may be free of a gate electrode material (e.g., metal). The region RG-1 may also reduce parasitic capacitance with both source/drain regions 150-1. Likewise, a second nanosheet stack 120-2 of the second transistor stack 110-2 is between a pair of source/drain regions 150-2 and has a gate-free region RG-2 that is adjacent a source/drain contact 140-2.

Figure 1B:
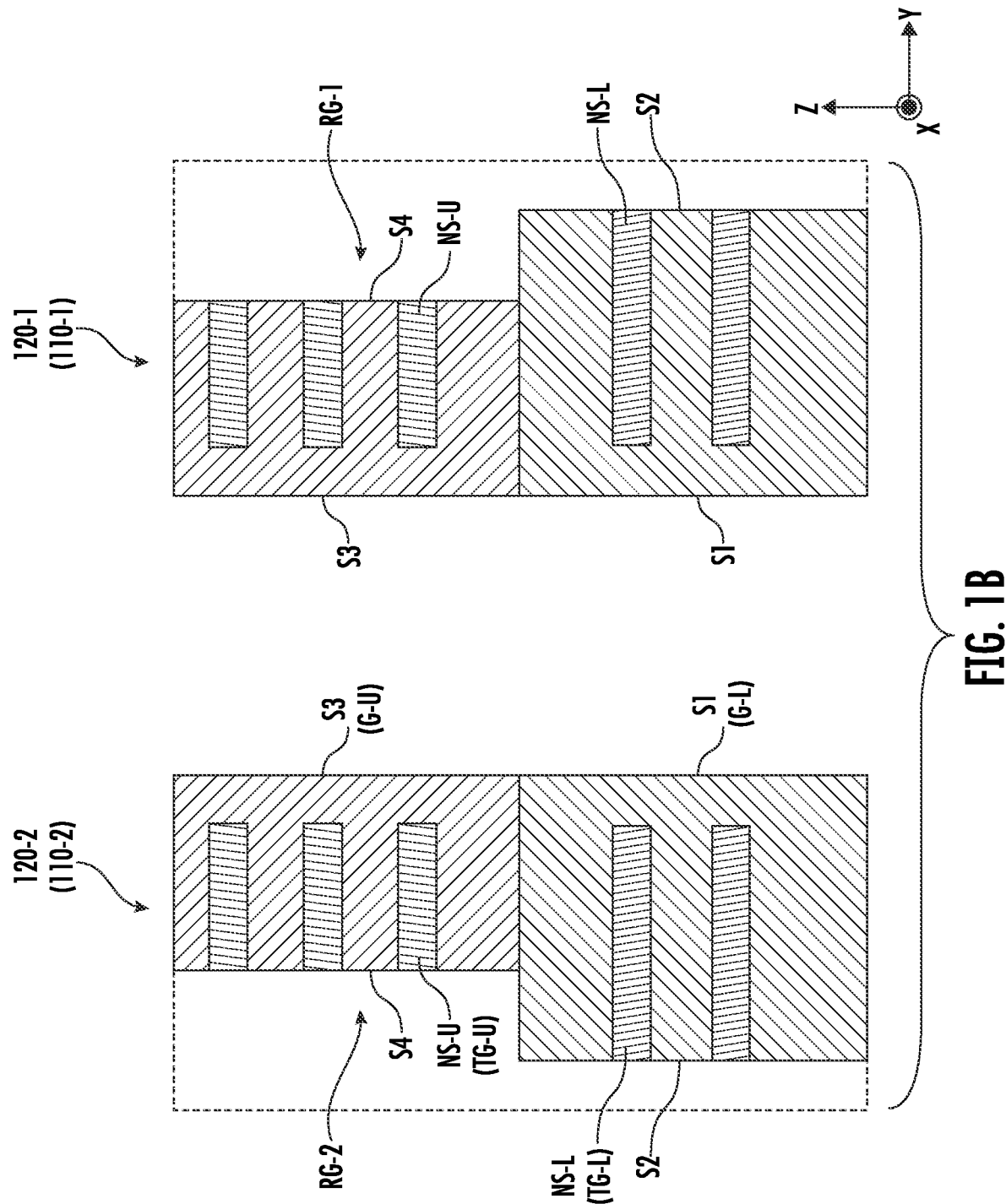
FIG. 1B is a cross-sectional view, taken along the direction Y, of the first and second nanosheet stacks of FIG. 1A.

FIG. 1B is a cross-sectional view, taken along the direction Y, of the first and second nanosheet stacks 120-1, 120-2 of FIG. 1A. As shown in FIG. 1B, each nanosheet stack 120 includes a plurality of lower nanosheets NS-L of a lower transistor TG-L and a plurality of upper nanosheets NS-U of an upper transistor TG-U. The upper nanosheets NS-U overlap the lower nanosheets NS-L in a vertical direction Z that is perpendicular to the horizontal directions X and Y.

The lower transistor TG-L further includes a lower gate G-L that is on the lower nanosheets NS-L. In the cross-sectional view of FIG. 1B, the lower gate G-L is shown on three sides of each of the lower nanosheets NS-L. The upper transistor TG-U likewise further includes an upper gate G-U that is on three sides of each of the upper nanosheets NS-U in the cross-sectional view of FIG. 1B. Accordingly, the transistors TG-L, TG-U shown in FIG. 1B are each tri-gate nanosheet transistors. In some embodiments, the gates G-L, G-U may be provided by a continuous gate electrode that is shared by the tri-gate transistors TG-L, TG-U. Moreover, each transistor stack 110 (FIG. 1A) may, in some embodiments, be a complementary field-effect transistor ("CFET") stack in which the lower tri-gate transistor TG-L and the upper tri-gate transistor TG-U are N-type and P-type transistors, respectively, or vice versa. Furthermore, though tri-gate transistors TG-L, TG-U are shown in FIG. 1B, other types of transistors, such as gate-all-around ("GAA") transistors (FIGS. 1E, 1F, 2B), may include nanosheets NS.

The lower gate G-L has opposite sidewalls S1, S2, and the upper gate G-U has opposite sidewalls S3, S4. The gate-free region RG is adjacent the sidewall S4 and vertically overlaps the lower gate G-L and the lower nanosheets NS-L. In some embodiments, the gate-free region RG may also be adjacent the sidewall S2. As shown in FIGS. 1A and 1B, the nanosheet stacks 120-1, 120-2 are mirror symmetrical, in that the gate-free regions RG-1, RG-2 face away from each other along the direction Y, as do the source/drain contacts 140-1, 140-2. The mirror symmetry thus increases a distance between the source/drain contacts 140-1, 140-2.

Moreover, the upper nanosheets NS-U may, in some embodiments, provide a fork sheet that extends in the direction Y toward the sidewall S3, where the sidewall S3 of the upper gate G-U of the first transistor stack 110-1 is opposite (i.e., faces) the sidewall S3 of the upper gate G-U of the second transistor stack 110-2. As a result, the upper nanosheets NS-U of the upper tri-gate transistor TG-U of the first transistor stack 110-1 and the upper nanosheets NS-U of the upper tri-gate transistor TG-U of the second transistor stack 110-2 have opposite fork-sheet directions from each other. As shown in FIG. 1B, upper nanosheets NS-U may have the same fork-sheet direction as lower nanosheets NS-L that are thereunder in a transistor stack 110. In other embodiments, however, upper nanosheets NS-U of a transistor stack 110 may have an opposite fork-sheet direction from that of lower nanosheets NS-L that are in the transistor stack 110, as described herein with respect to FIG. 1D.

Figure 1C:
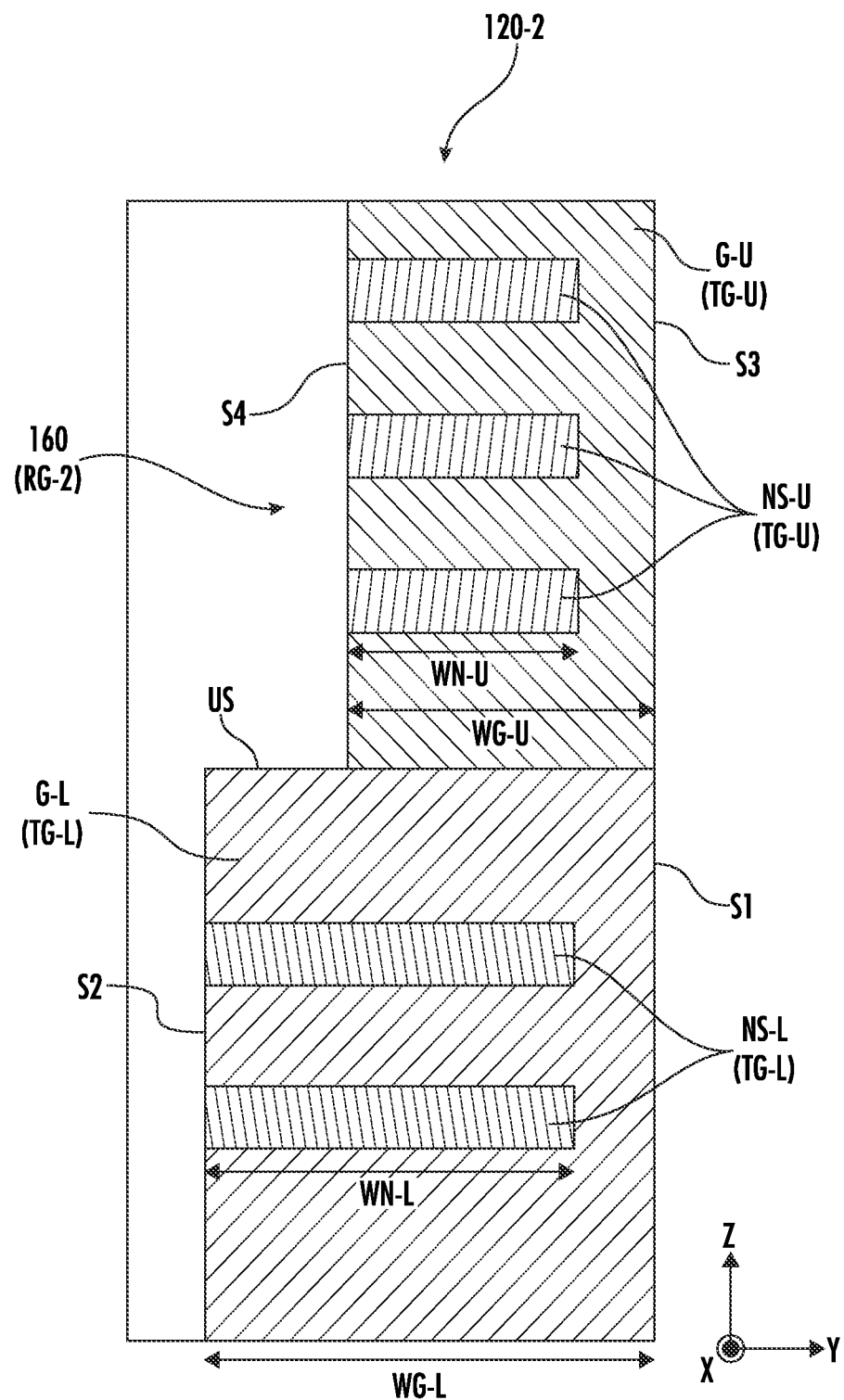
FIG. 1C is an enlarged view of the second nanosheet stack of FIG. 1B.

FIG. 1C is an enlarged view of the second nanosheet stack 120-2 of FIG. 1B. As shown in FIG. 1C, the gate-free region RG may comprise an insulation region 160 that is on an upper surface US of the lower gate G-L and the sidewall S4 of the upper gate G-U. Moreover, the insulation region 160 may contact respective sidewalls of the upper nanosheets NS-U and may vertically overlap the lower nanosheets NS-L. The insulation region 160 may comprise, for example, silicon nitride or silicon oxide. In some embodiments, the insulation region 160 may comprise a low-k spacer, which can provide better capacitance-reduction than a higher-k insulator. As used herein, the term "low-k" refers to a material that has a smaller dielectric constant than silicon dioxide.

FIG. 1C also illustrates that the upper nanosheets NS-U each have a width WN-U that is different from a width WN-L of each of the lower nanosheets NS-L. The nanosheet stack 120-2 is thus an sNS structure. Example sNS structures are discussed in U.S. Provisional Patent Application Ser. No. 63/086,781, filed on Oct. 2, 2020, the disclosure of which is hereby incorporated herein in its entirety by reference. Specifically, the width WN-U is narrower than the width WN-L. Moreover, due to the gate-free region RG, a width WG-U of the upper gate G-U is narrower than a width WG-L of the lower gate G-L. The narrower width WG-U can reduce parasitic capacitance between the upper gate G-U and a source/drain contact 140 (FIG. 1A), as well as parasitic capacitance between the upper gate G-U and source/drain regions 150 (FIG. 1A).

Due to its wider gate width WG-L and wider nanosheet width WN-L, the lower tri-gate transistor TG-L can have fewer (e.g., two versus three) nanosheets than the upper tri-gate transistor TG-U, while still having the same total nanosheet cross-sectional area (and/or the same total nanosheet surface area) as the upper tri-gate transistor TG-U. In some embodiments, as shown in FIG. 1C, the sidewall S3 of the upper gate G-U may be aligned with the sidewall S1 of the lower gate G-L. The sidewall S4, however, of the upper gate G-U may vertically overlap the lower nanosheets NS-L, given the narrower width WG-U of the upper gate G-U.

Figure 3A:
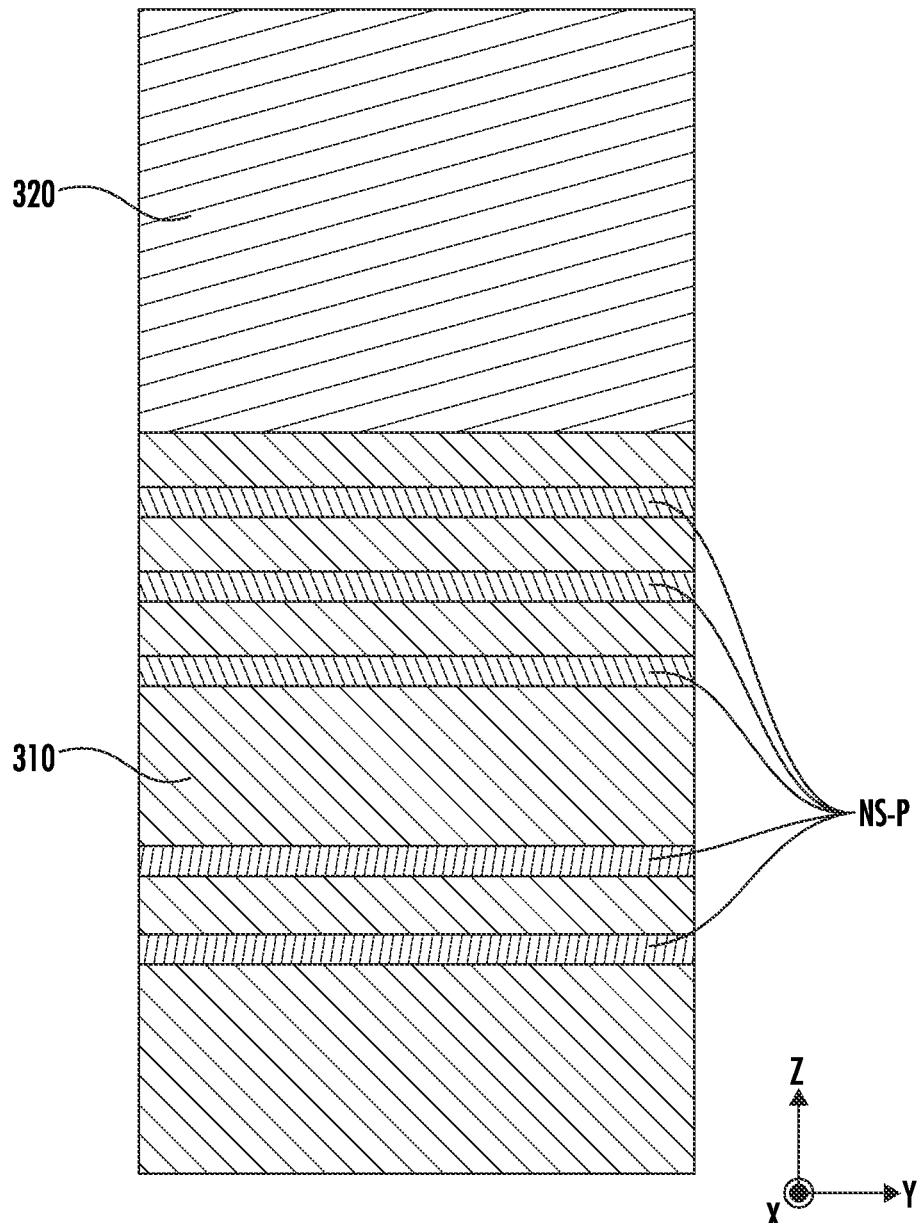
FIGS. 3A-3N are cross-sectional views illustrating operations of forming the nanosheet stack of FIG. 1C.

Moreover, because the transistors TG-L, TG-U are tri-gate transistors, the lower nanosheets NS-L are spaced apart from the sidewall S1 by a material (e.g., metal) of the lower gate G-L and the upper nanosheets NS-U are spaced apart from the sidewall S3 by a material (e.g., metal) of the upper gate G-U. For example, a first distance in the direction Y between the sidewall S1 and the lower nanosheets NS-L may be calculated by subtracting the width WN-L from the width WG-L. Likewise, a second distance in the direction Y between the sidewall S3 and the upper nanosheets NS-U may be calculated by subtracting the width WN-U from the width WG-U. In some embodiments, the first distance may equal the second distance, such as when the nanosheet stack 120 is formed according to the operations that are shown in FIGS. 3A-3N.

For simplicity of illustration, a gate insulation layer is omitted from view in FIG. 1C. It will be understood, however, that a gate insulation layer may extend between each nanosheet NS and the gate G. Also, for simplicity of illustration, a substrate is omitted from view in FIG. 1C. It will be understood, however, that the nanosheets NS may be vertically stacked on a substrate. Specifically, the lower tri-gate transistor TG-L may be between the upper tri-gate transistor TG-U and the substrate.

Figure 1D:
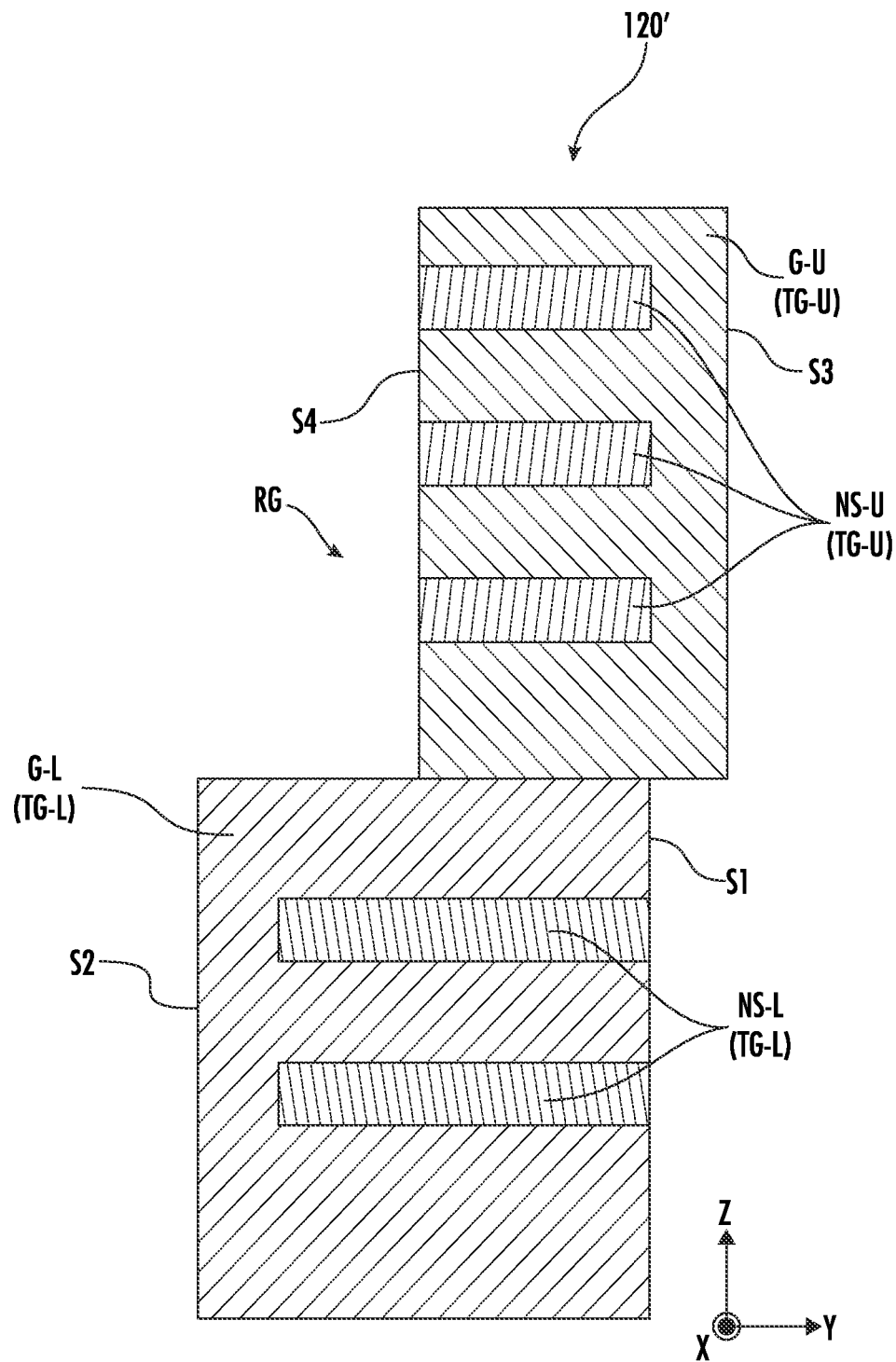
FIGS. 1D-1F are cross-sectional views of nanosheet stacks according to other embodiments of the present invention.
Figure 1E:
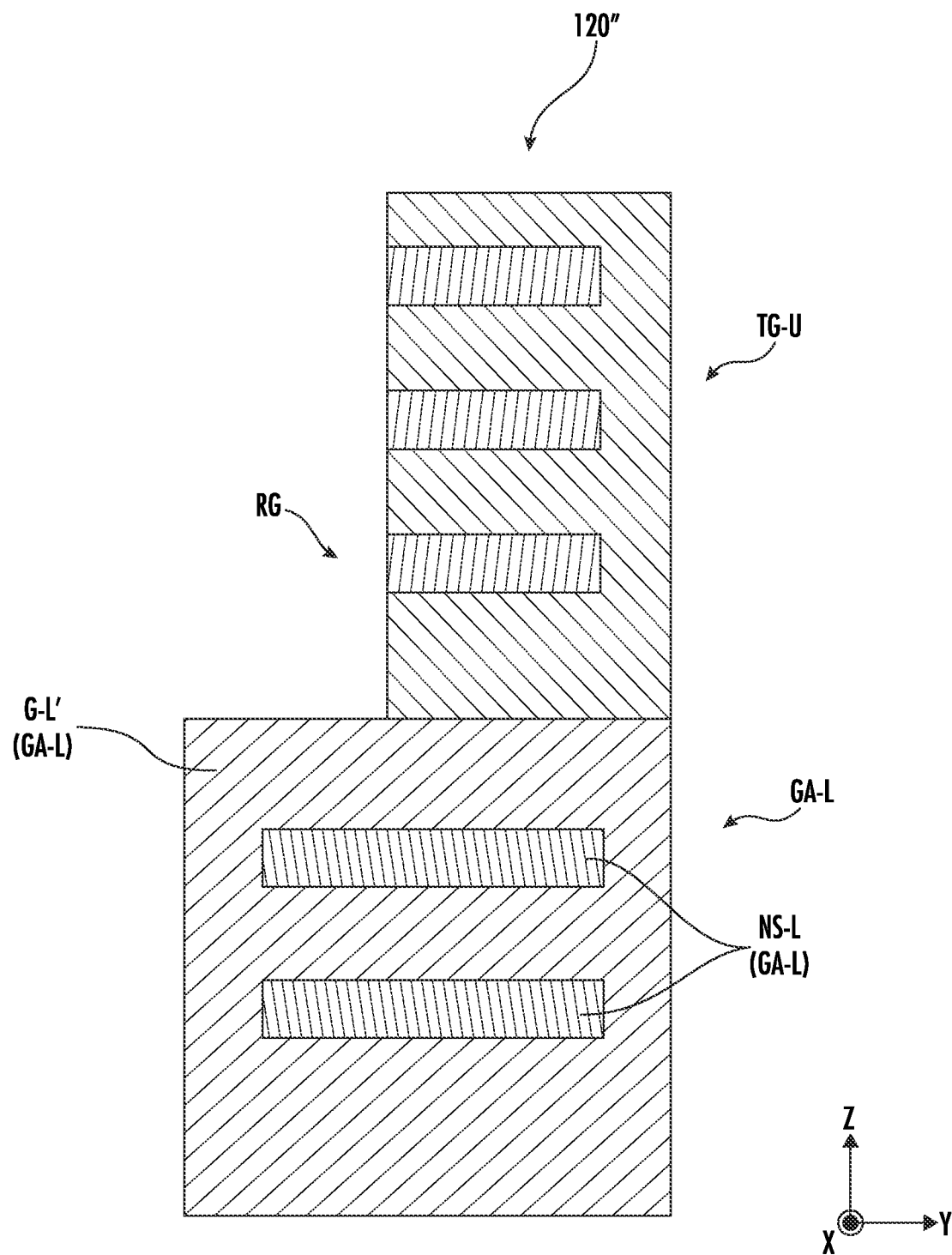
Figure 1F:
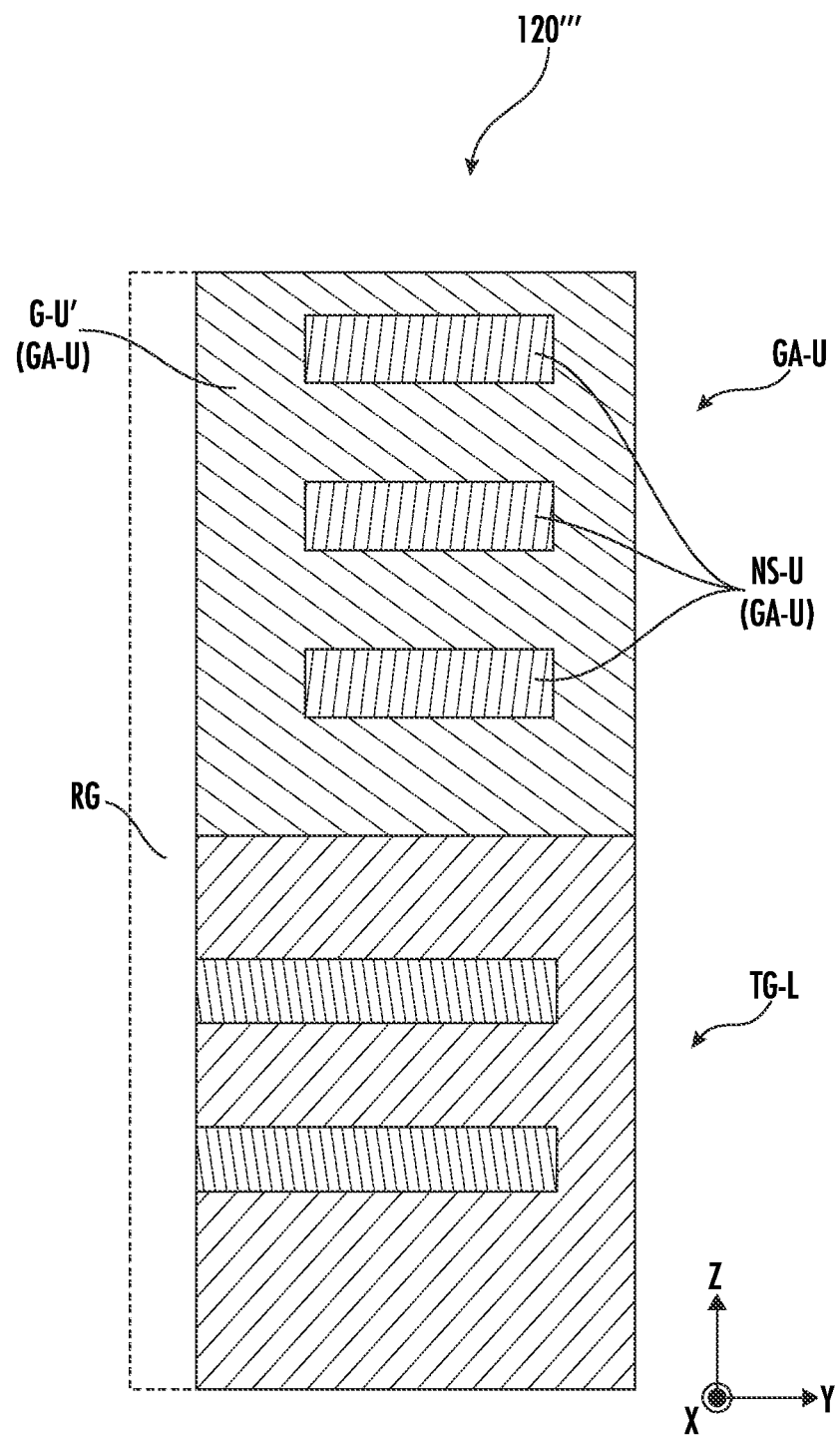

FIGS. 1D-1F are cross-sectional views of nanosheet stacks 120', 120", and 120'", respectively, according to other embodiments of the present invention. As shown in FIG. 1D, the sidewall S3 of the upper gate G-U may be offset from, rather than vertically aligned with, the sidewall S1 of the lower gate G-L. For example, the lower nanosheets NS-L may be spaced apart from the sidewall S2, rather than the sidewall S1, by a material of the lower gate G-L such that the lower nanosheets NS-L have a fork-sheet direction that is opposite a fork-sheet direction of the upper nanosheets NS-U.

A transistor stack 110 (FIG. 1A) is not limited to tri-gate transistors. Rather, the transistor stack 110 may include both a tri-gate transistor and a GAA transistor.

For example, referring to FIG. 1E, the lower nanosheets NS-L may be surrounded by a gate G-L' of a GAA transistor GA-L. A tri-gate transistor TG-U is stacked above the GAA transistor GA-L. As another example, referring to FIG. 1F, the upper nanosheets NS-U may be part of a GAA transistor GA-U that is stacked above a tri-gate transistor TG-L.

Though the gate G-U' of the GAA transistor GA-U is shown in FIG. 1F as having a similar width in the direction Y as a gate of the tri-gate transistor TG-L, the gate G-U' may, in some embodiments, have a narrower width due to a gate-free region RG of the GAA transistor GA-U. For example, the GAA transistor GA-U may have a wider gate-free region RG than the tri-gate transistor TG-L, or the tri-gate transistor TG-L may not have a gate-free region RG that is vertically overlapped by the gate-free region RG of the GAA transistor GA-U. Moreover, for simplicity of illustration, the insulation region 160 (FIG. 1C) is omitted from view in FIGS. 1D-1F. A gate-free region RG in any of FIGS. 1D-1F, however, may comprise the insulation region 160 therein. Also, a gate-free region RG may be in any of (i) a lower transistor, (ii) an upper transistor, or (iii) both the upper transistor and the lower transistor of a transistor stack 110 (FIG. 1A).

Figure 2A:
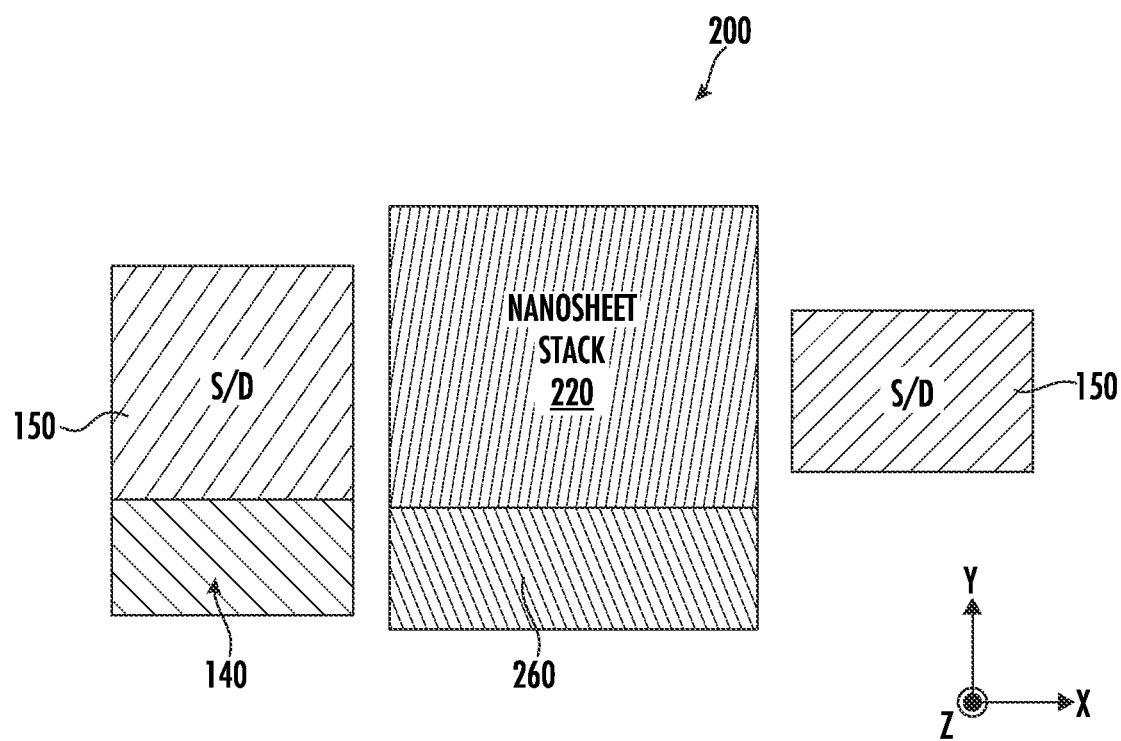
FIG. 2A is a plan view of a nanosheet transistor device according to further embodiments of the present invention.

FIG. 2A is a plan view of a nanosheet transistor device 200 according to further embodiments of the present invention. The device 200 comprises a transistor stack that includes a nanosheet stack 220 that is between, in the direction X, source/drain regions 150. To reduce parasitic capacitance with a source/drain contact 140 (and with the source/drain regions 150), the nanosheet stack 220 includes an insulation region 260. The insulation region 260 may comprise, for example, a low-k spacer. As an example, the insulation region 260 may be a lower-k region than another insulation region 280 (FIG. 2B) that is on the gate G. For simplicity of illustration, only one nanosheet stack 220 is shown in the device 200. In some embodiments, however, the device 200 may include two, three, four, or more nanosheet stacks 220.

Figure 2B:
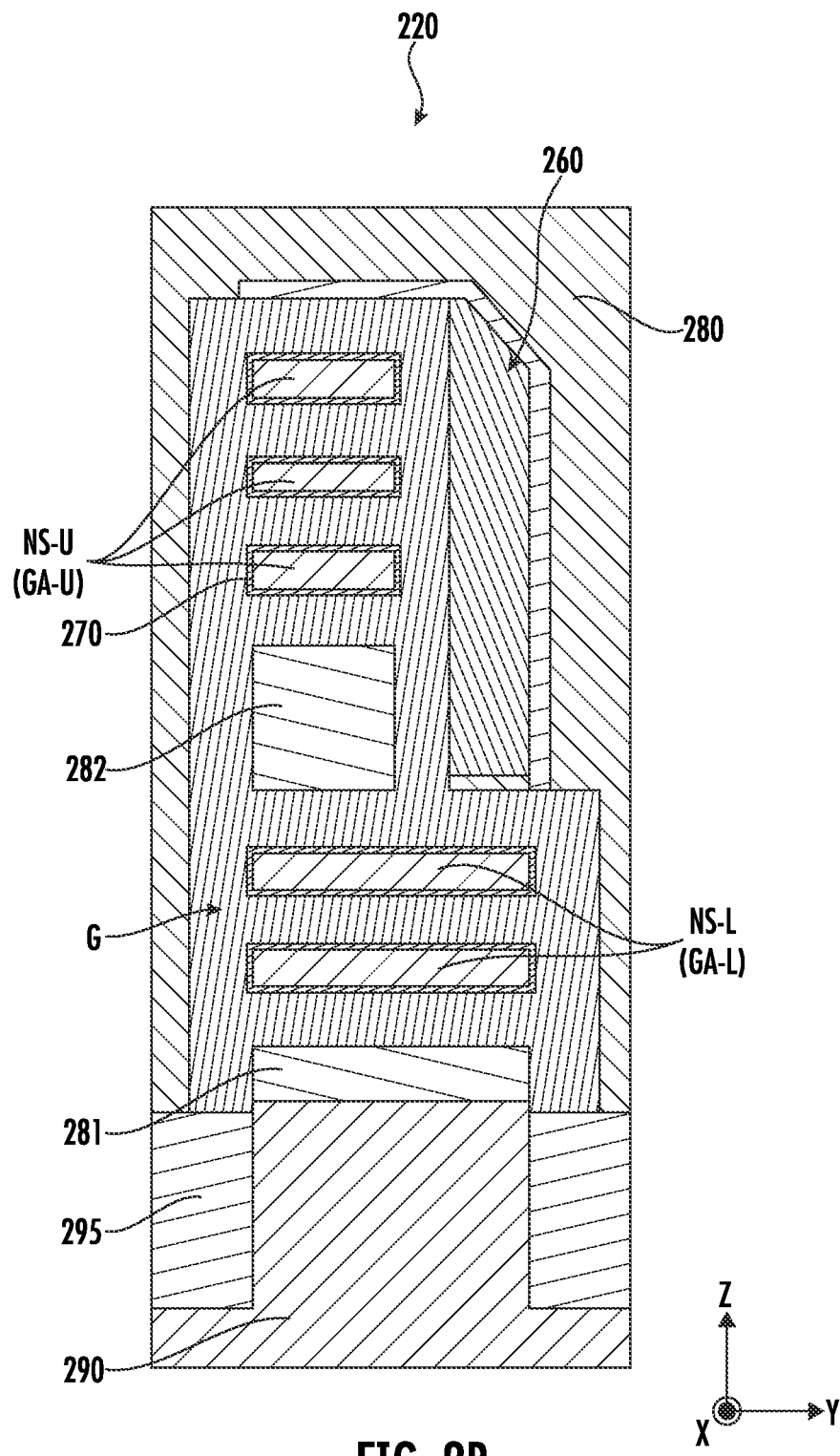
FIG. 2B is a cross-sectional view, taken along the direction Y, of the nanosheet stack of FIG. 2A.

FIG. 2B is a cross-sectional view, taken along the direction Y, of the nanosheet stack 220 of FIG. 2A. As shown in FIG. 2B, the nanosheet stack 220 includes a plurality of lower nanosheets NS-L that are vertically overlapped by a plurality of upper nanosheets NS-U, and further includes a gate G that is shared by the nanosheets NS-L, NS-U. Unlike the nanosheet stacks 120 (FIG. 1B) of tri-gate transistors TG (FIG. 1B), the nanosheets NS-L, NS-U of the nanosheet stack 220 are all surrounded by the gate G (e.g., by a metal gate electrode). The nanosheets NS-L, NS-U of the nanosheet stack 220 are thus nanosheets of a lower GAA transistor GA-L and an upper GAA transistor GA-U, respectively. Accordingly, each vertically-stacked transistor of the device 200 (FIG. 2A) may be a GAA transistor GA. Moreover, each stack of two transistors in the device 200 may, in some embodiments, be a CFET stack in which the lower GAA transistor GA-L and the upper GAA transistor GA-U are N-type and P-type transistors, respectively, or vice versa.

The insulation region 260 may contact a sidewall of the gate G of the upper GAA transistor GA-U, and may be between the sidewall of the gate G and the insulation region 280. The insulation region 280 may contact an opposite sidewall of the gate G of the upper GAA transistor GA-U, and may be on an upper surface of the gate G of the upper GAA transistor GA-U. Moreover, the insulation region 260 may be on an upper surface of the gate G of the lower GAA transistor GA-L, and may vertically overlap the lower nanosheets NS-L.

As is further shown in FIG. 2B, the nanosheets NS are vertically stacked on an upper surface of a vertically-protruding portion of a substrate 290, and device isolation regions 295 are on opposite sides of the vertically-protruding portion. The lower GAA transistor GA-L may be between the upper GAA transistor GA-U and the substrate 290, which may be, for example, a semiconductor substrate. FIG. 2B also illustrates that an insulation region 281 may be between the lower nanosheets NS-L and the upper surface of the vertically-protruding portion of the substrate 290, and that an insulation region 282 may be between the upper nanosheets NS-U and the lower nanosheets NS-L. In some embodiments, however, the insulation regions 281, 282 may be omitted. Moreover, FIG. 2B illustrates a gate insulation layer 270, which may extend between each nanosheet NS and the gate G.

FIGS. 3A-3N are cross-sectional views illustrating operations of forming the nanosheet stack 120 of FIG. 1C. Referring to FIG. 3A, a sacrificial material 310 may be between vertically-stacked preliminary nanosheets NS-P, which may have equal widths in the direction Y. The sacrificial material 310 may comprise, for example, a semiconductor material, such as silicon germanium, and the preliminary nanosheets NS-P may each be, for example, a silicon sheet. The sacrificial material 310 and the preliminary nanosheets NS-P may collectively be referred to herein as a "preliminary transistor stack."

An insulating material 320 may be on the preliminary nanosheets NS-P and the sacrificial material 310. As an example, the insulating material 320 may be an oxide or nitride, such as silicon oxide or silicon nitride. The insulating material 320 may serve as an etch mask (e.g., a hard mask) that protects the preliminary nanosheets NS-P and the sacrificial material 310.

Figure 3B:
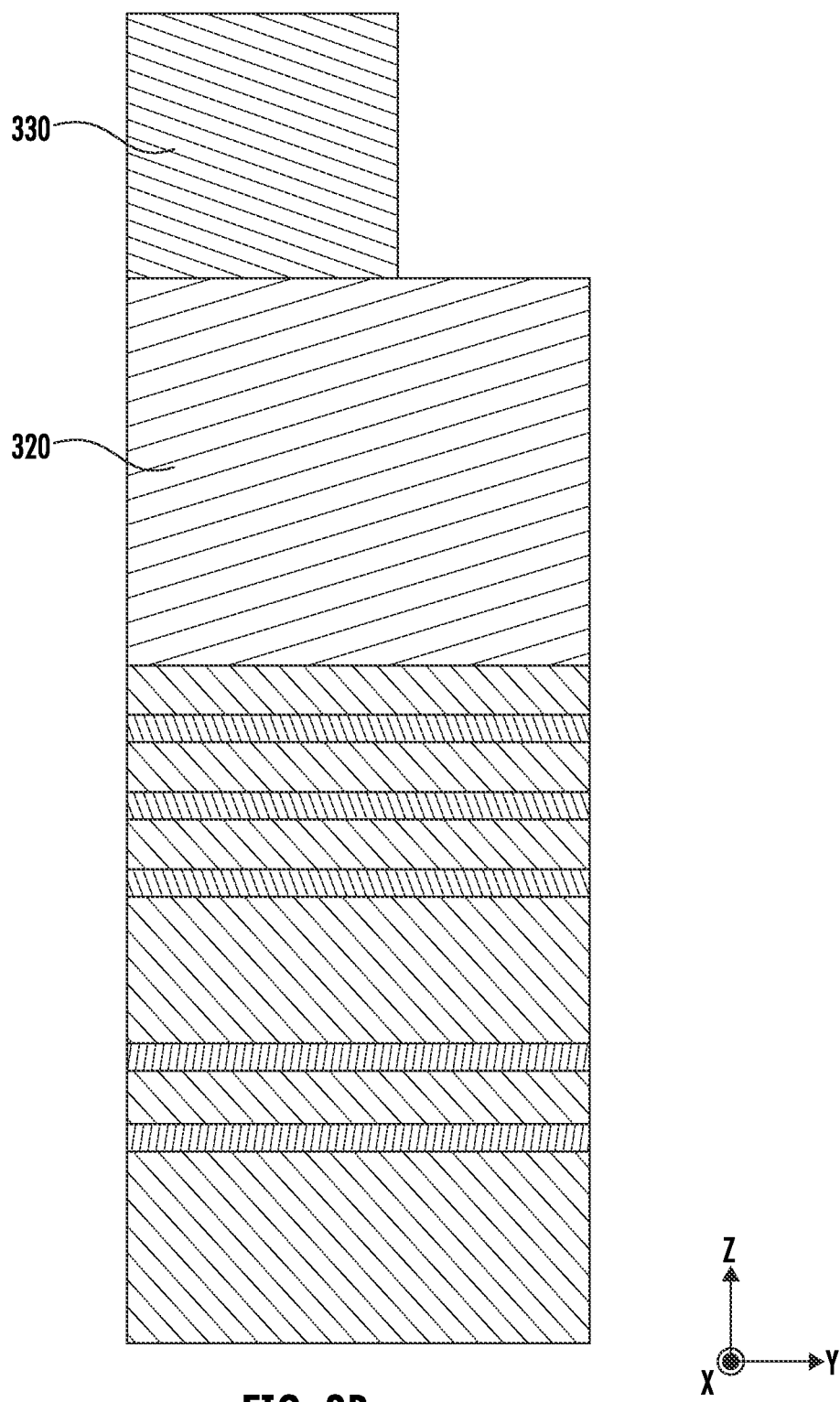

Referring to FIG. 3B, an insulating material 330 having an etch selectivity with respect to the insulating material 320 is formed on the insulating material 320. For example, the insulating material 330 may be silicon oxide if the insulating material 320 is silicon nitride, and the insulating material 330 may be silicon nitride if the insulating material 320 is silicon oxide. As shown in FIG. 3B, the insulating material 330 exposes a portion of an upper surface of the insulating material 320.

Figure 3C:
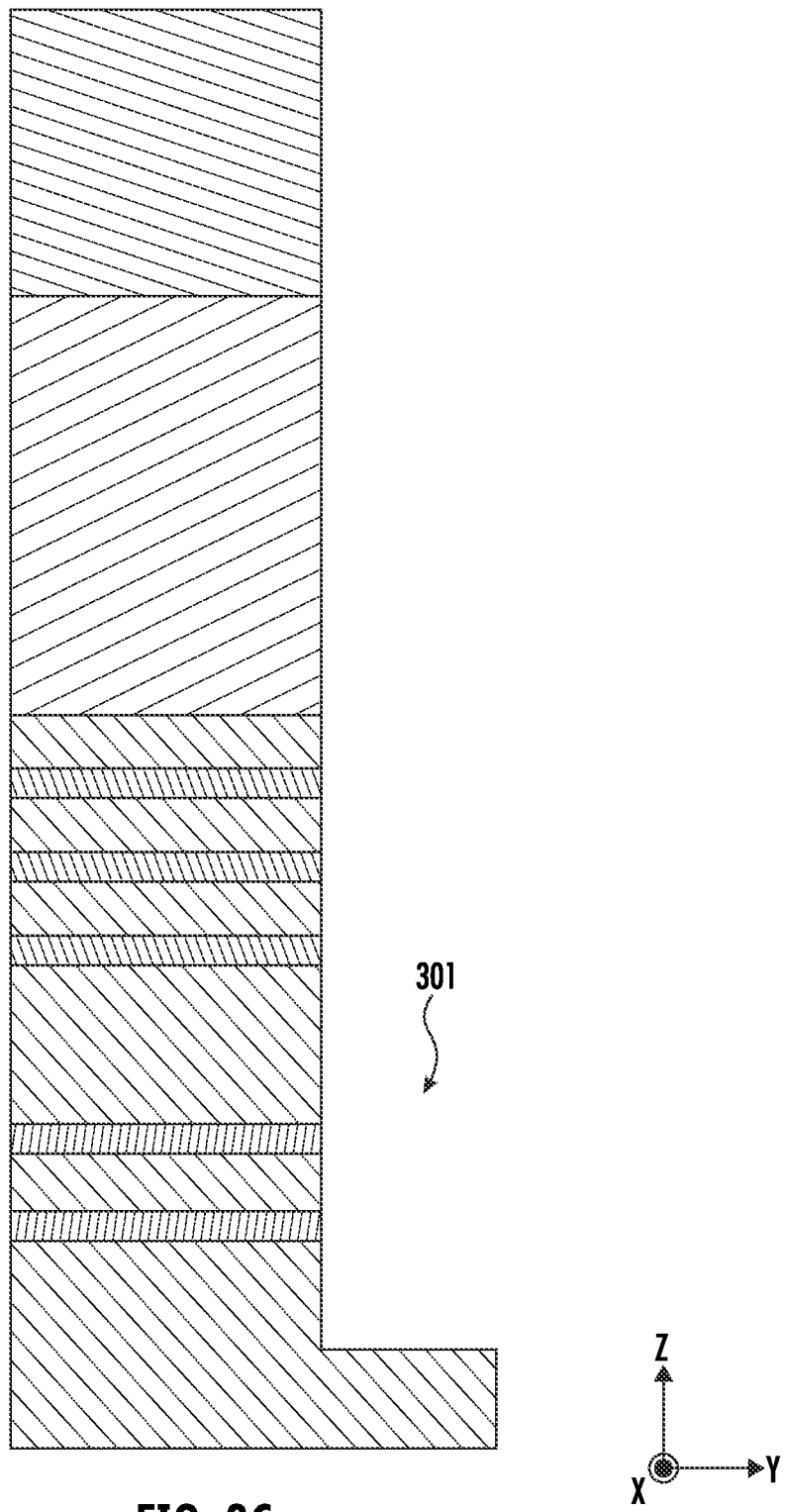

Referring to FIG. 3C, the exposed portion of the insulating material 320 (FIG. 3B) is removed, along with underlying portions of the preliminary nanosheets NS-P (FIG. 3A) and the sacrificial material 310 (FIG. 3A), to form a recess region 301. For example, the insulating material 330 (FIG. 3B) may be used as an etch mask (e.g., a hard mask) while etching the exposed portion of the insulating material 320.

Figure 3D:
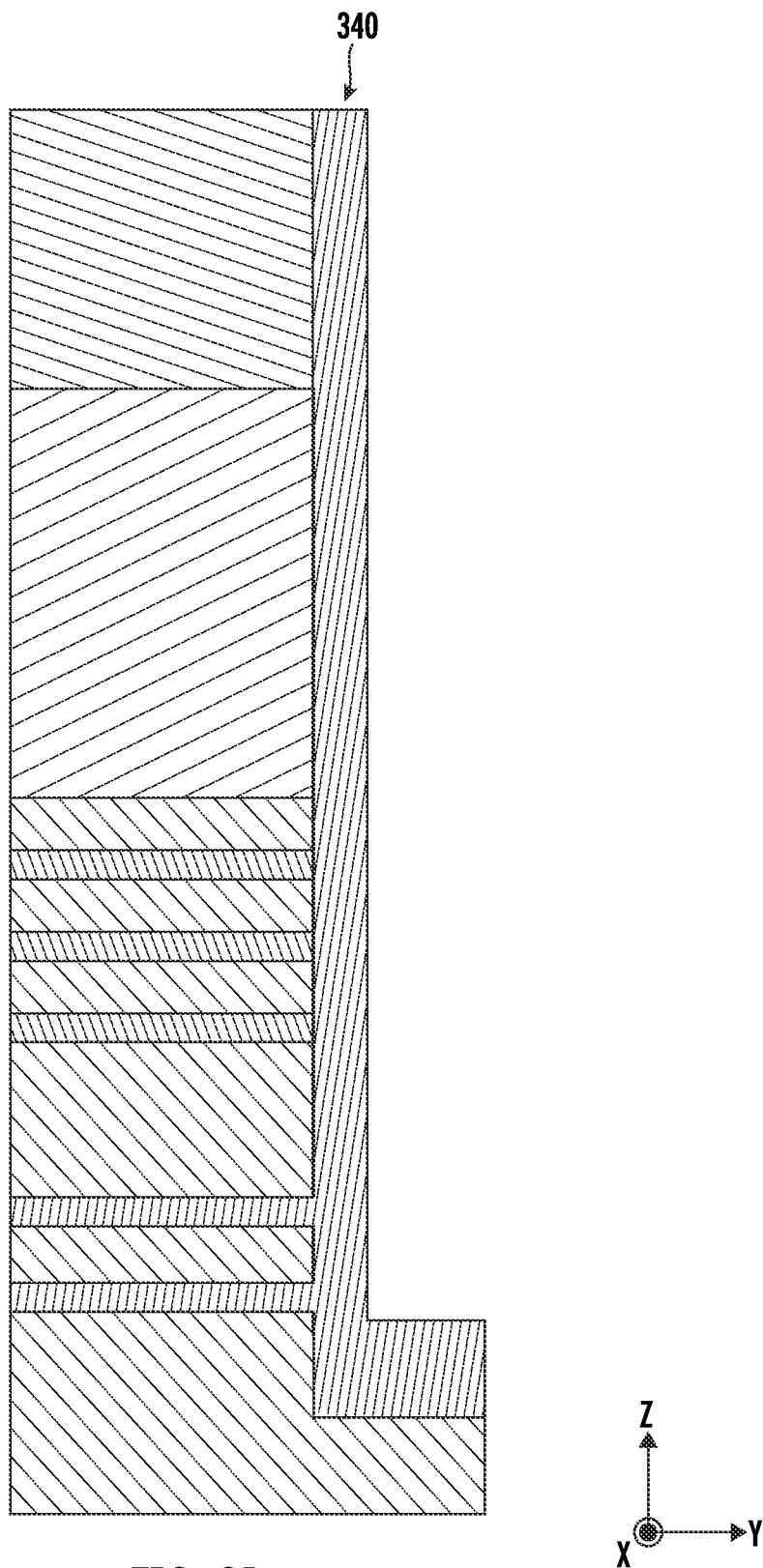

Referring to FIG. 3D, a spacer 340 is formed in the recess region 301 (FIG. 3C) and on sidewalls of the sacrificial material 310, the preliminary nanosheets NS-P, and the insulating materials 320, 330 (FIGS. 3A and 3B). The spacer 340 may comprise, for example, an oxide, such as silicon oxide.

Figure 3E:
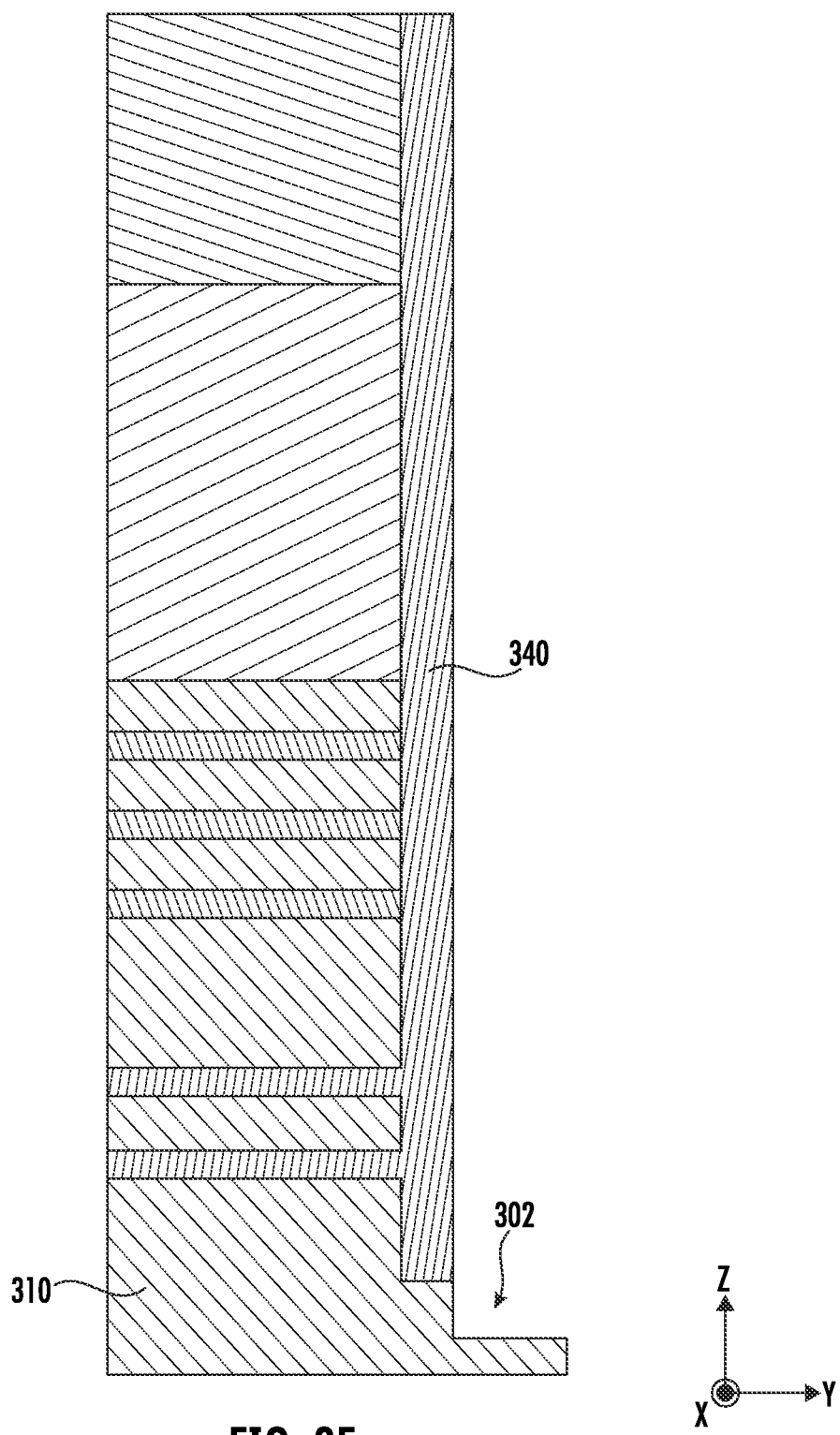

Referring to FIG. 3E, a portion of the spacer 340 that protrudes in the direction Y may be removed to form a recess region 302 that exposes an upper surface and a sidewall of the sacrificial material 310.

Figure 3F:
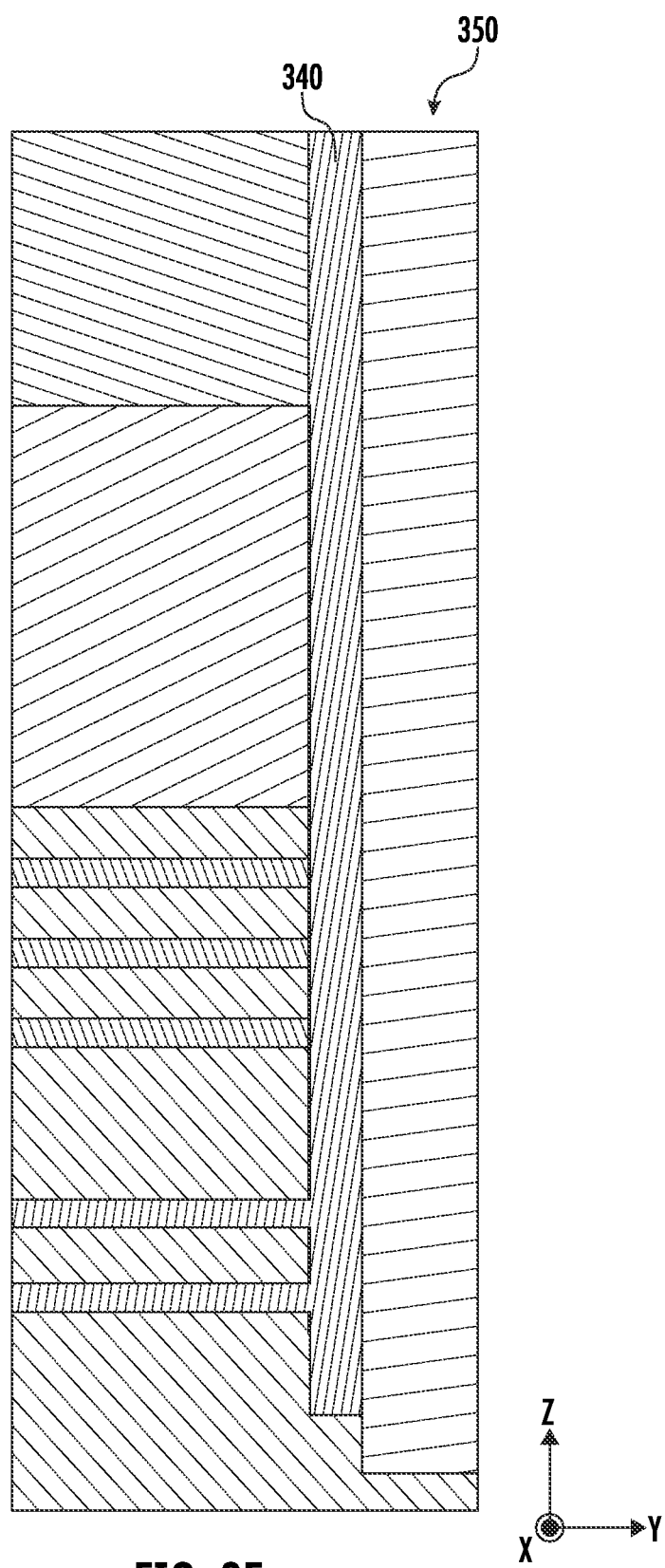

Referring to FIG. 3F, an insulating material 350 is formed in the recess region 302 (FIG. 3E) and on a sidewall of the spacer 340. The insulating material 350 has an etch selectivity with respect to the spacer 340. For example, the insulating material 350 comprises an oxide if the spacer 340 comprises a nitride, and the insulating material 350 comprises a nitride if the spacer 340 comprises an oxide. As an example, the insulating material 350 may comprise silicon nitride.

Figure 3G:
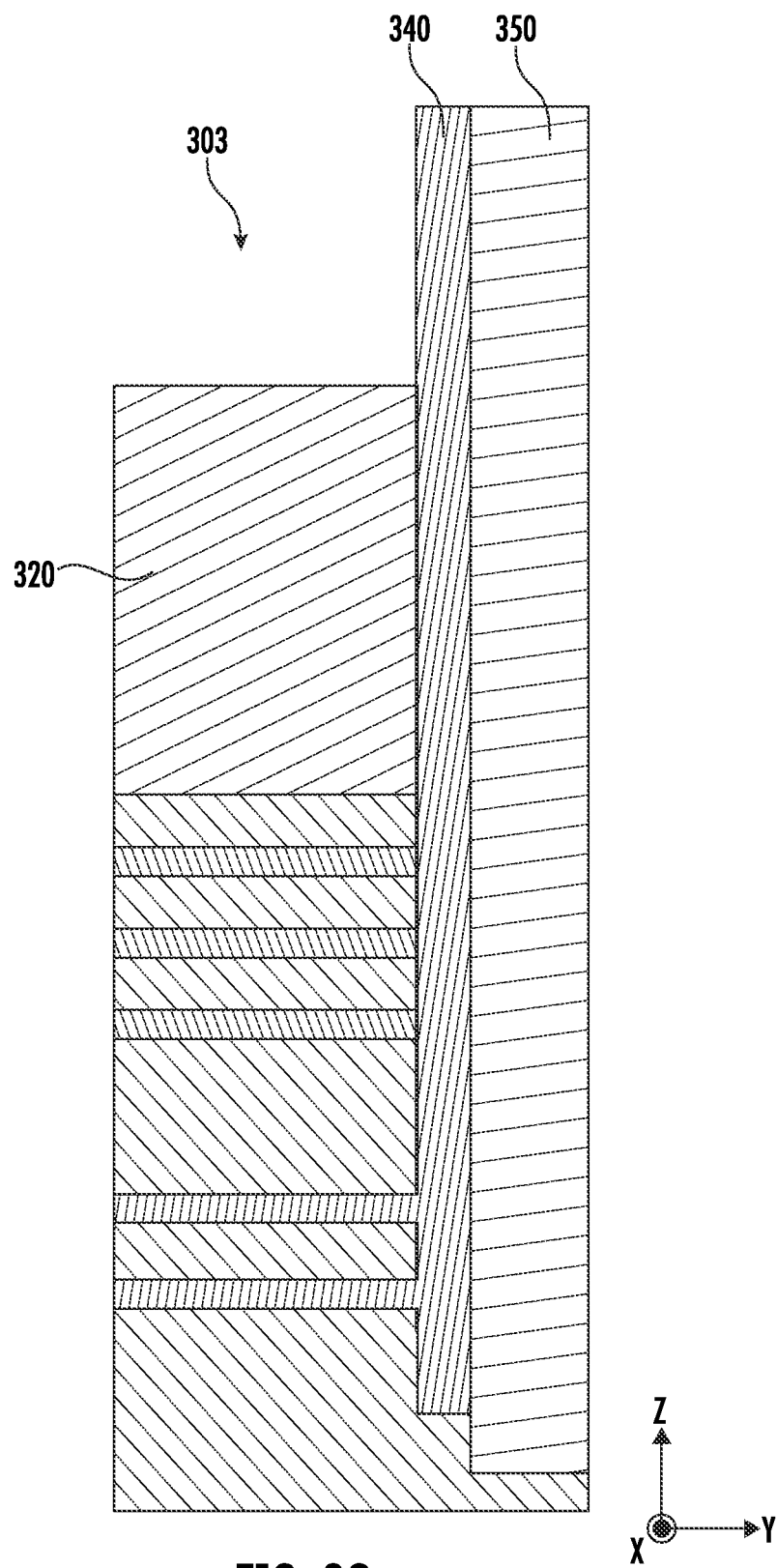

Referring to FIG. 3G, the insulating material 330 (FIG. 3B) is removed to form a recess region 303 that exposes an upper surface of the remaining portion of the insulating material 320 and a portion of a sidewall of the spacer 340.

Figure 3H:
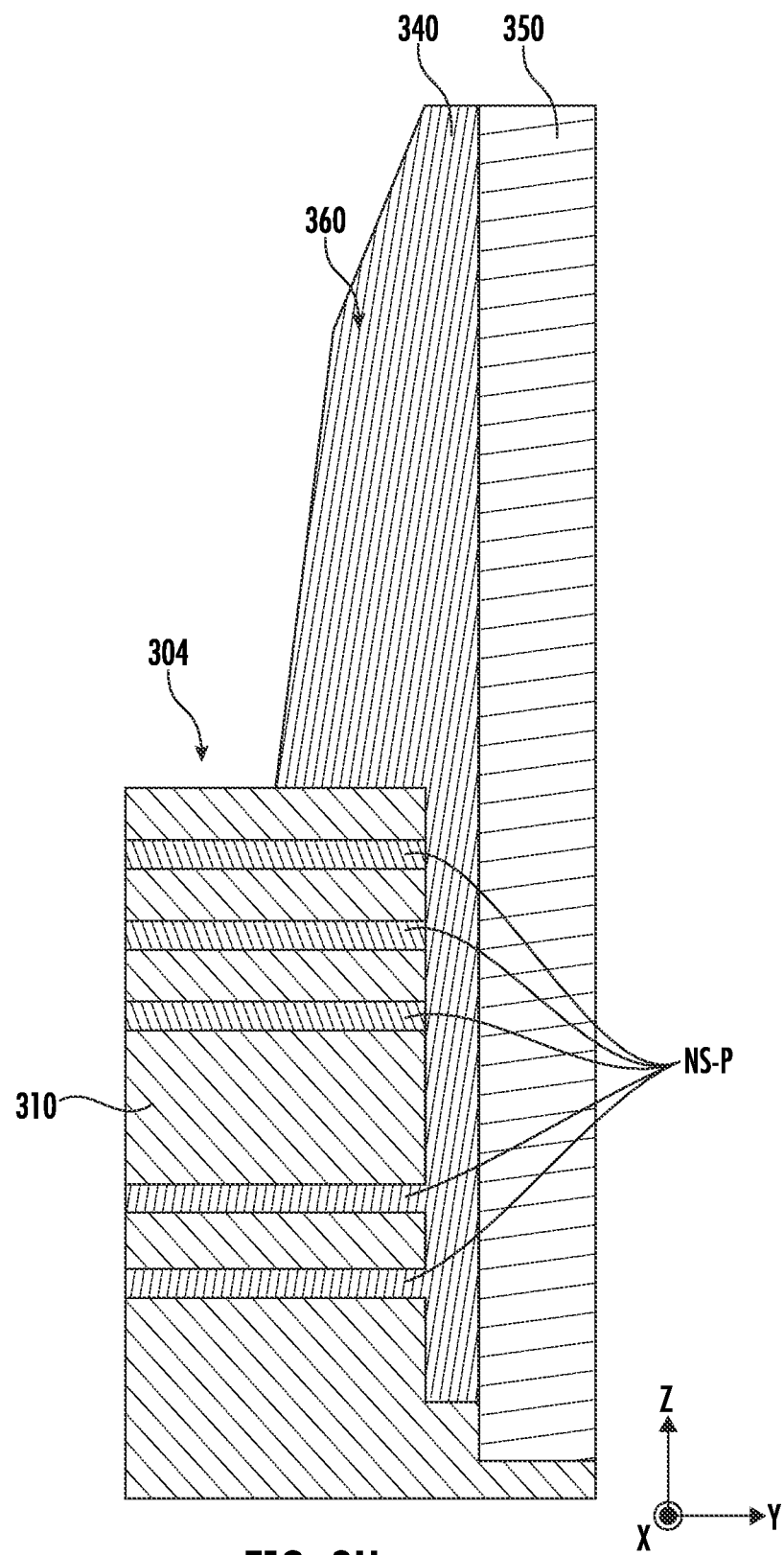

Referring to FIG. 3H, the insulating material 320 (FIG. 3G) is removed (e.g., by using a selective etching process) to form a recess region 304 that exposes an upper surface of the sacrificial material 310 and a portion of a sidewall of the spacer 340. Also, an insulating material 360 is formed (e.g., deposited) on the sidewall of the spacer 340. The insulating material 360 and the spacer 340 may comprise the same material (e.g., silicon oxide or silicon nitride).

Figure 3I:
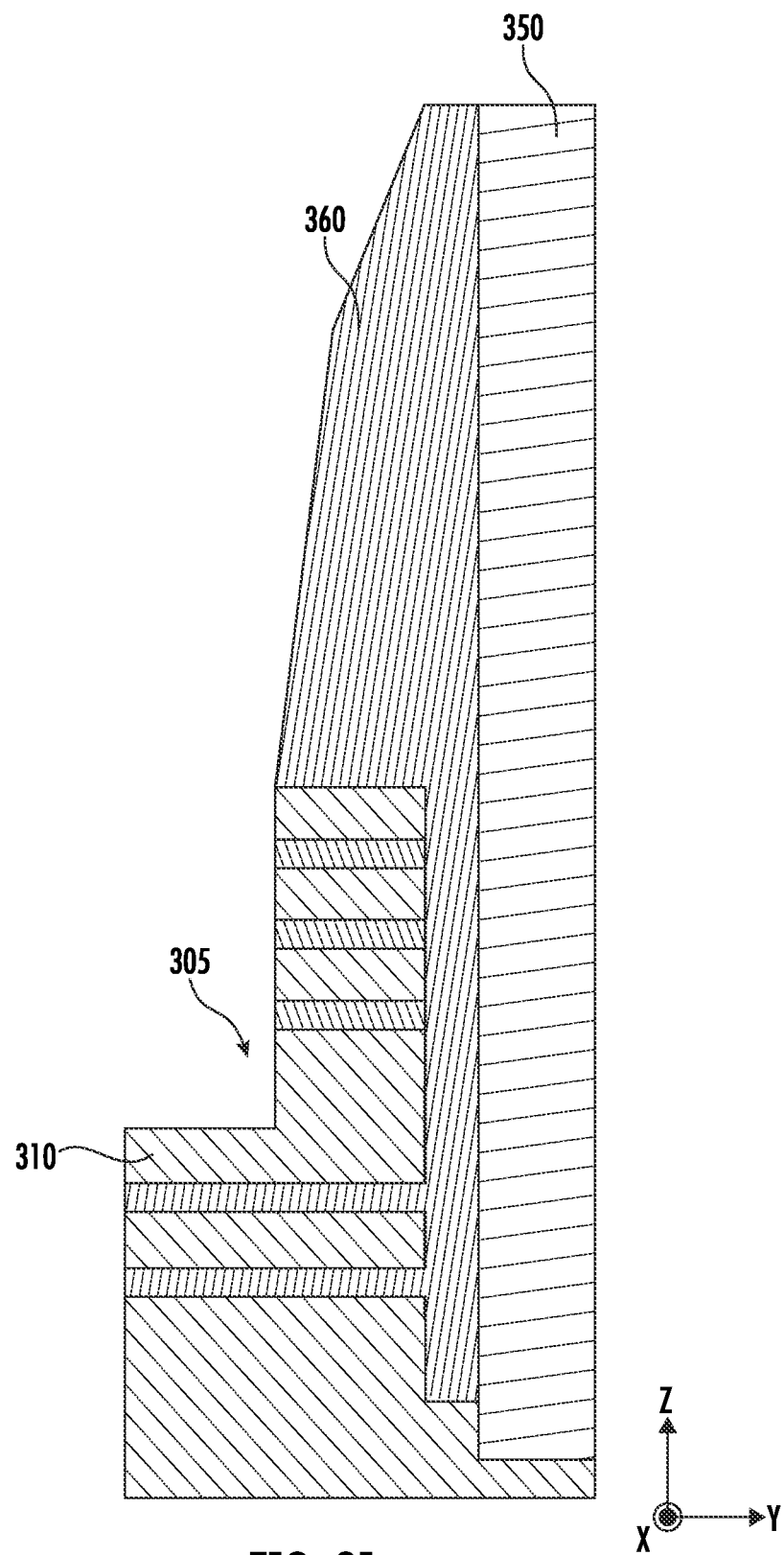

Referring to FIG. 3I, a portion of an upper surface of the sacrificial material 310 that remains exposed after forming the insulating material 360 is removed, along with an underlying portion of the three uppermost nanosheets NS of the preliminary nanosheets NS-P (FIG. 3A) to a point about midway between the upper nanosheet stack and the lower nanosheet stack. As a result, the three uppermost nanosheets NS are narrower, in the direction Y, than the two lowermost nanosheets NS. Moreover, this removal forms a recess region 305 that exposes sidewalls of the three uppermost nanosheets NS and exposes an upper surface of the sacrificial material 310 that vertically overlaps the two lowermost nanosheets NS.

Figure 3J:
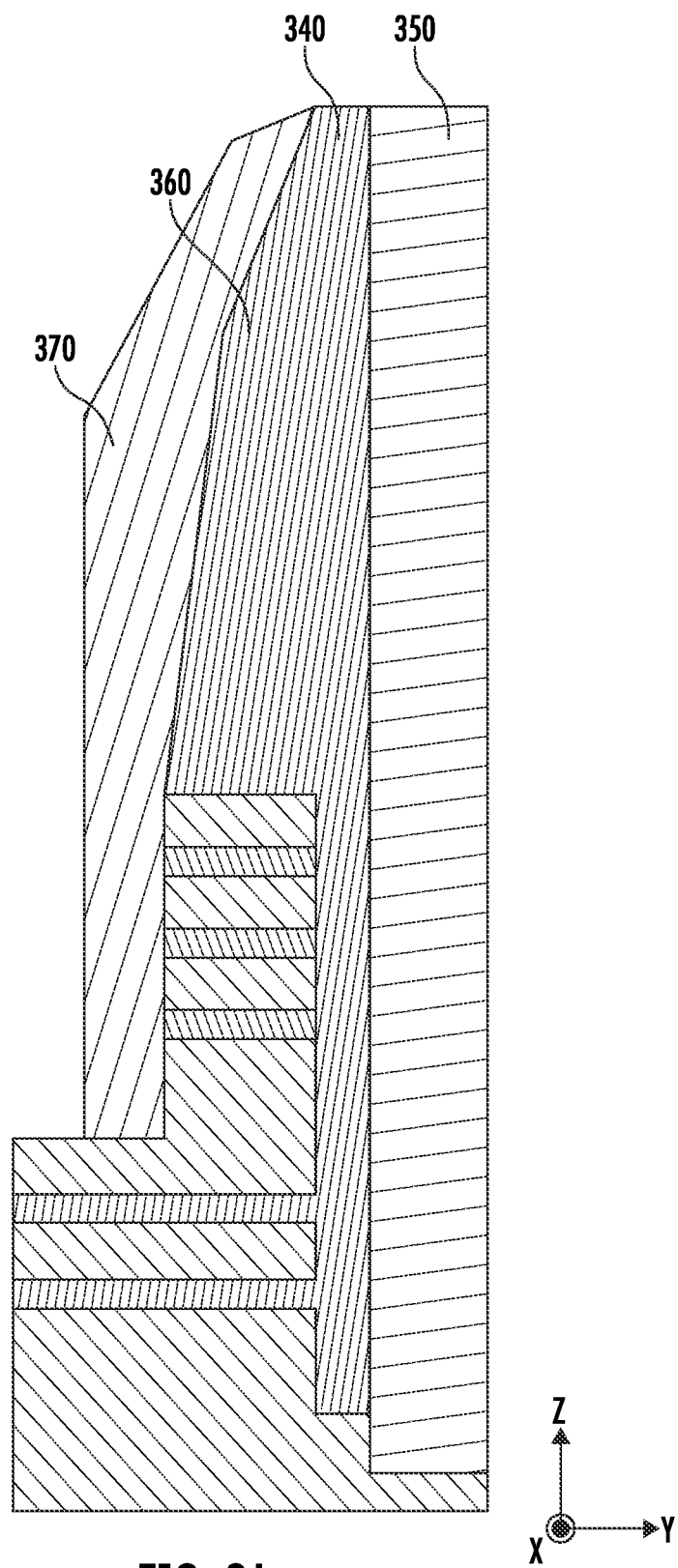

Referring to FIG. 3J, a spacer 370 is formed (e.g., by depositing another insulating material) on the insulating material 360 and on the exposed sidewalls of the three uppermost nanosheets NS. The spacer 370 overlaps the two lowermost nanosheets NS and contacts sidewalls of a portion of the three uppermost nanosheets NS that remains after forming the recess region 305. The spacer 370 may comprise, for example, silicon nitride or silicon oxide, and may have an etch selectivity with respect to the spacer 340 and the insulating material 360.

Figure 3K:
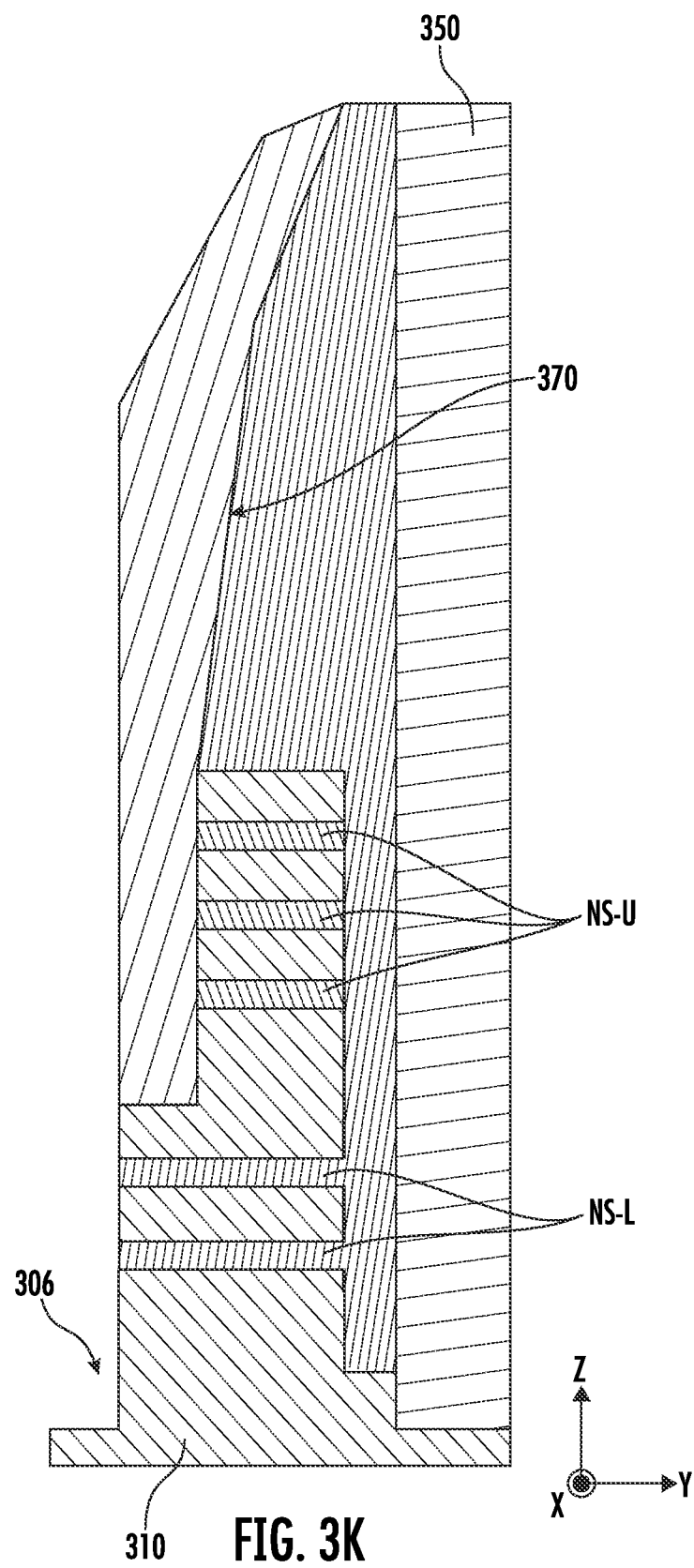

Referring to FIG. 3K, a recess region 306 is formed by removing an exposed portion of the upper surface of the sacrificial material 310, along with underlying portions of the two lowermost nanosheets NS, thus forming two lower nanosheets NS-L. The recess region 306 exposes sidewalls of the two lower nanosheets NS-L. The nanosheets NS-L are vertically overlapped by the spacer 370 and by upper nanosheets NS-U, which are the three uppermost nanosheets NS.

Figure 3L:
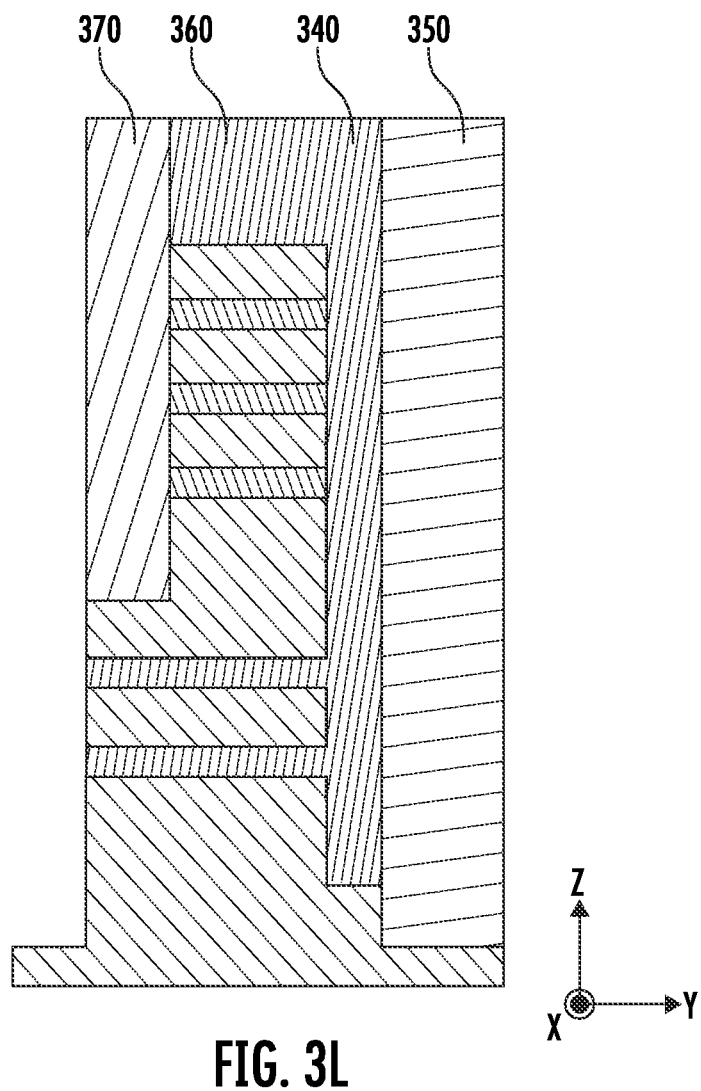

Referring to FIG. 3L, a planarization process (e.g., chemical mechanical planarization) is performed to remove upper portions of the spacer 340, the spacer 370, the insulating material 360, and the insulating material 350. For example, the planarization process may remove tilted surfaces of the spacer 370 and the insulating material 360, and result in upper surfaces of the spacer 340, the spacer 370, the insulating material 360, and the insulating material 350 that are closer to the nanosheets NS.

Figure 3M:
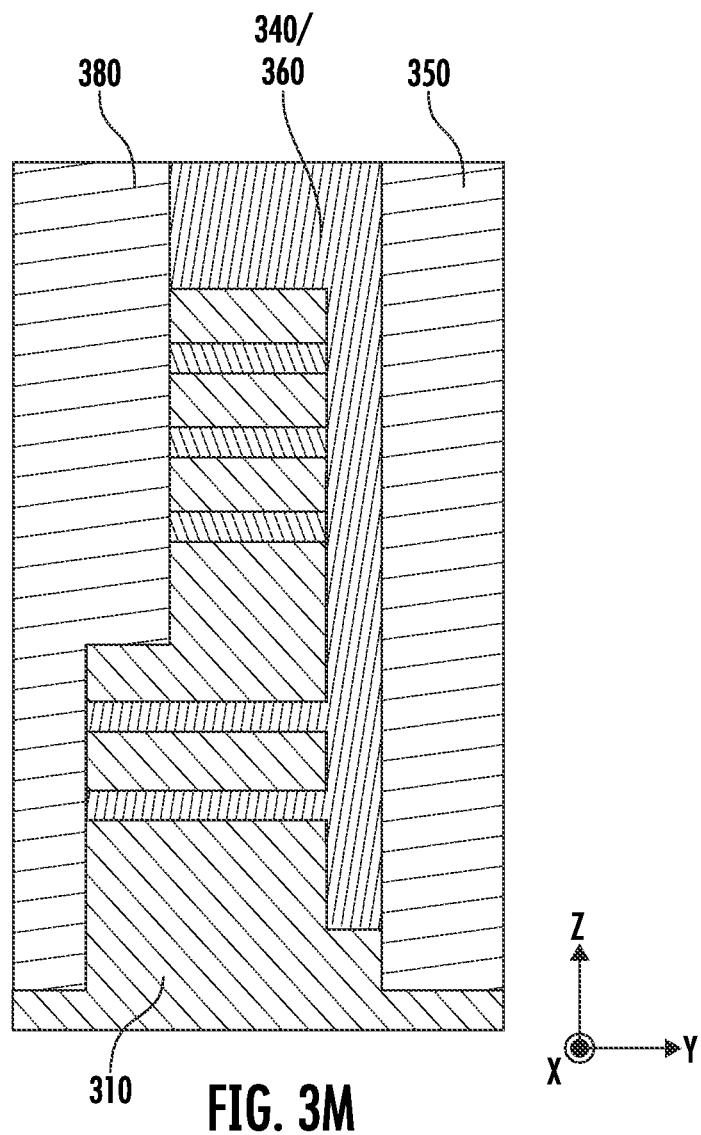
Figure 3N:
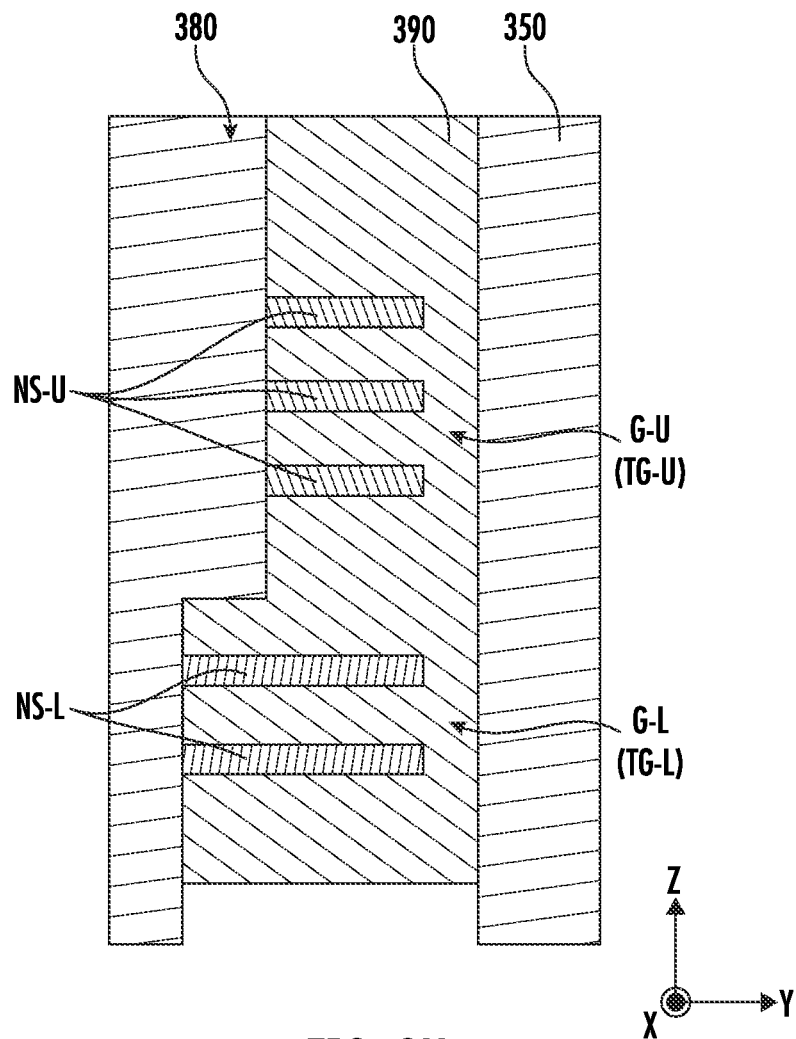

Referring to FIG. 3M, the portion of the spacer 370 that remains after the planarization process is removed and is replaced with a spacer 380. The spacer 380 may comprise the same material as the insulating material 350, and thus may have an etch selectivity with respect to the spacer 340 and the insulating material 360. For example, the spacer 380 may comprise silicon nitride. In some embodiments, the spacer 380 may provide the insulation region 160 that is shown in FIG. 1C.

Referring to FIG. 3N, the sacrificial material 310 (FIG. 3M), the spacer 340 (FIG. 3M), and the insulating material 360 (FIG. 3M) are replaced with a gate electrode material 390, such as a metal. For example, the spacer 340 and the insulating material 360 may be removed and then the sacrificial material 310 may be removed, or vice versa, and resulting openings in the structure may be filled with the gate electrode material 390. As a result, a lower gate G-L of a lower tri-gate transistor TG-L and an upper gate G-U of an upper tri-gate transistor TG-U are formed. The gates G-L, G-U shown in FIG. 3N may thus each be referred to herein as a "tri-gate."

Figure 4:
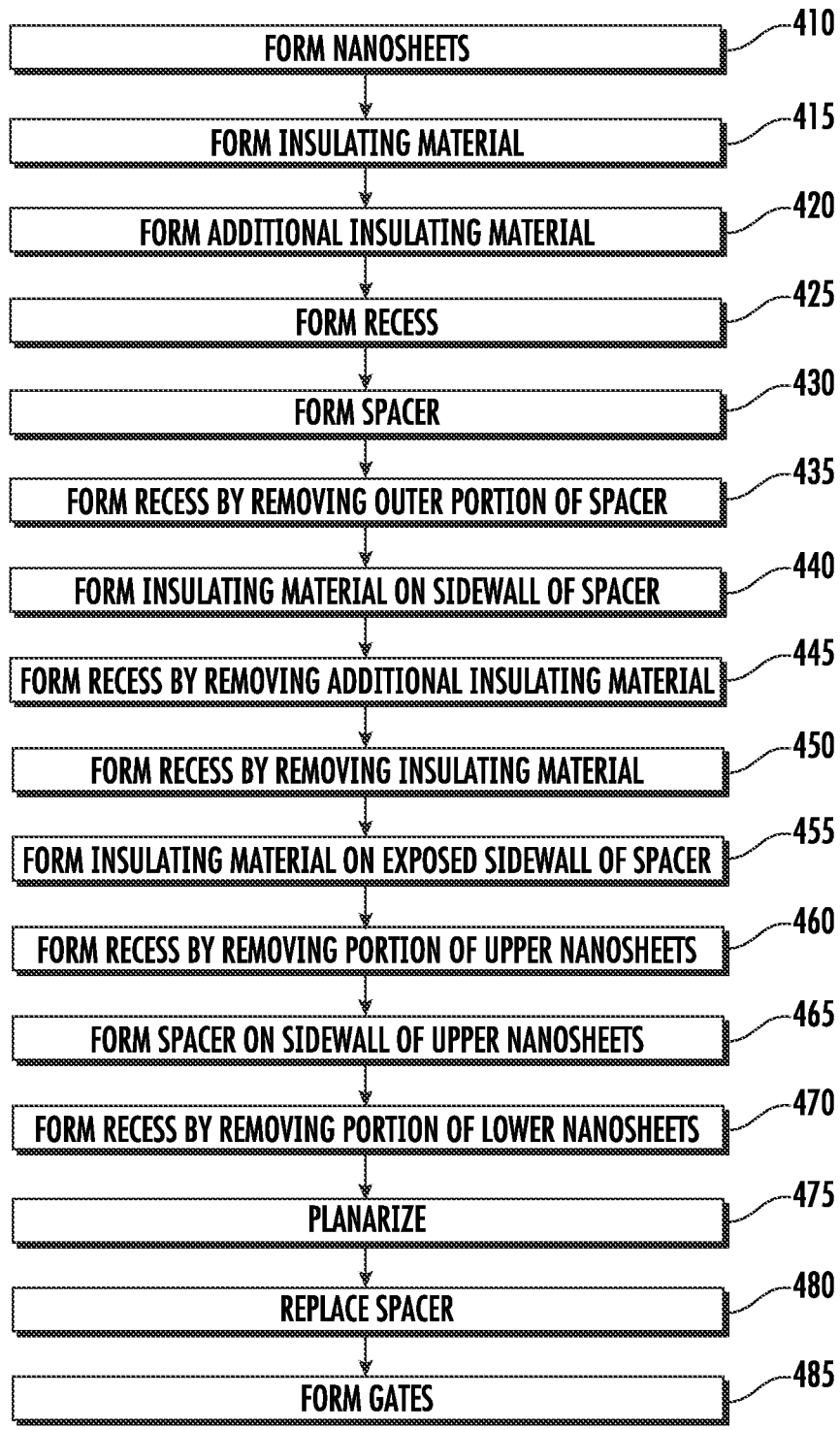
FIG. 4 is a flowchart illustrating operations of forming the nanosheet stack of FIG. 1C.

FIG. 4 is a flowchart illustrating operations of forming the nanosheet stack 120 of FIG. 1C. These operations correspond to those that are shown in the cross-sectional views of FIGS. 3A-3N. The operations include forming (Block 410) vertically-stacked preliminary nanosheets NS-P (FIG. 3A) of a preliminary transistor stack. The preliminary nanosheets NS-P include lower nanosheets and upper nanosheets that are stacked on the lower nanosheets. Moreover, the preliminary transistor stack also includes a sacrificial material 310 (FIG. 3A) that is on the lower nanosheets and the upper nanosheets.

An insulating material 320 (FIG. 3A) is formed (Block 415) on the preliminary transistor stack. Subsequently, an insulating material 330 (FIG. 3B) having an etch selectivity with respect to the insulating material 320 is formed (Block 420) on the insulating material 320. A recess region 301 (FIG. 3C) is then formed (Block 425) by removing an exposed portion of the insulating material 320, along with underlying portions of the preliminary nanosheets NS-P (FIG. 3A) and the sacrificial material 310 (FIG. 3A).

A spacer 340 (FIG. 3D) is formed (Block 430) in the recess region 301. Another recess region 302 (FIG. 3E) is formed (Block 435) by removing an outer (e.g., horizontally-protruding lower) portion of the spacer 340 to expose an upper surface and a sidewall of the sacrificial material 310 (FIG. 3E). Moreover, an insulating material 350 (FIG. 3F) is formed (Block 440) in the recess region 302 and on a sidewall of the spacer 340.

Another recess region 303 (FIG. 3G) is formed (Block 445) by removing the insulating material 330 (FIG. 3B) to expose an upper surface of the insulating material 320 and an upper portion of a sidewall of the spacer 340. Next, the insulating material 320 is removed (Block 450) to form a recess region 304 (FIG. 3H) that exposes an upper surface of the sacrificial material 310 and a middle portion of the sidewall of the spacer 340. An insulating material 360 (FIG. 3H) is then formed (Block 455), such as by deposition thereof, on the exposed sidewall of the spacer 340 and on a portion of the exposed upper surface of the sacrificial material 310.

A further recess region 305 (FIG. 3I) is formed by removing (Block 460) a portion of the sacrificial material 310, as well as portions of the three uppermost nanosheets NS that are thereunder, to narrow a width of three uppermost nanosheets NS. For example, a portion of the preliminary transistor stack that is exposed by the recess region 304 (FIG. 3H) may be etched until reaching a portion of the sacrificial material 310 that is between the three uppermost nanosheets NS and the two lowermost nanosheets NS. A spacer 370 (FIG. 3J) is formed (Block 465) on the insulating material 360 and on exposed sidewalls of the three uppermost nanosheets NS after forming the recess region 305. A recess region 306 (FIG. 3K) is then formed (Block 470) by removing an exposed portion of the upper surface of the sacrificial material 310, along with underlying portions of the two lowermost nanosheets NS.

A planarization process (Block 475) is performed to remove upper portions of the spacer 340, the spacer 370, the insulating material 360, and the insulating material 350. An example result of the planarization process is shown in FIG. 3L. The portion of the spacer 370 that remains after the planarization process is then removed and replaced (Block 480) with a spacer 380 (FIG. 3M) that covers a respective sidewall of each nanosheet NS. Next, lower and upper gates G-L, G-U (FIG. 3N) are formed (Block 485) on the lower and upper nanosheets NS-L, NS-U, respectively, by replacing the sacrificial material 310 (FIG. 3M), the spacer 340 (FIG. 3M), and the insulating material 360 (FIG. 3M) with a gate electrode material 390 (FIG. 3N).

Nanosheet transistor devices 100, 200 (FIGS. 1A and 2A) according to embodiments of the present invention may provide a number of advantages. These advantages include reducing parasitic capacitance between a gate G (FIGS. 1C and 2B) and a source/drain contact 140 (FIGS. 1A and 2A). Parasitic capacitance can be reduced by decreasing the amount of gate electrode material that is adjacent the source/drain contact 140 and/or by aligning (in the direction X; FIG. 1A) an insulation region 160, 260 (FIGS. 1C and 2A), which may comprise a low-k spacer rather than the gate electrode material, with the source/drain contact 140. For example, the amount of gate electrode material may be reduced by using at least one tri-gate transistor TG (FIGS. 1C-1F) in place of a GAA transistor in a transistor stack 110 (FIG. 1A). As a result, a transistor stack (e.g., a CFET stack) with an sNS structure may have different gate widths WG-L, WG-U (FIG. 1C).

Moreover, the reduced parasitic capacitance can improve alternating current ("AC") speed/performance of the devices 100, 200. For example, by reducing a drain-side capacitance, AC speed/performance can be boosted, such as by boosting the frequency of a logic circuit in one of the devices 100, 200.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "I" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A method of forming a nanosheet transistor device, the method comprising:
   forming a preliminary transistor stack comprising a first plurality of nanosheets and a second plurality of nanosheets on the first plurality of nanosheets;
   forming a recess in the preliminary transistor stack by removing a first portion of the second plurality of nanosheets; and
   forming a spacer in the recess,
   wherein the spacer overlaps the first plurality of nanosheets in a direction and contacts a second portion of the second plurality of nanosheets that remains after removing the first portion,
   wherein a lower end of the recess is at a position that is different than an upper surface of an uppermost nanosheet among the first plurality of nanosheets in the direction, and
   wherein the position of the lower end of the recess is different than a lower surface of a lowermost nanosheet among the second plurality of nanosheets in the direction.

2. The method of claim 1, further comprising forming a first tri-gate and a second tri-gate on the first plurality of nanosheets and the second plurality of nanosheets, respectively, after forming the spacer.

3. The method of claim 2,
   wherein the preliminary transistor stack further comprises a sacrificial material that is on the first plurality of nanosheets and the second plurality of nanosheets,
   wherein removing the first portion of the second plurality of nanosheets comprises removing a first portion of the sacrificial material, and
   wherein forming the first tri-gate and the second tri-gate comprises replacing with a metal gate material:
      a second portion of the sacrificial material that remains on the first plurality of nanosheets and the second plurality of nanosheets after removing the first portion of the sacrificial material; and
      an insulating material that is on the first plurality of nanosheets and the second plurality of nanosheets and that has an etch selectivity with respect to the spacer.

4. The method of claim 3, wherein forming the spacer comprises forming the spacer on a sidewall of the sacrificial material, a sidewall of the first plurality of nanosheets, and a sidewall of the second plurality of nanosheets.

5. The method of claim 1, wherein the lower end of the recess is between the upper surface of the uppermost nanosheet among the first plurality of nanosheets and the lower surface of the lowermost nanosheet among the second plurality of nanosheets in the direction.

6. A method of forming a nanosheet transistor device, the method comprising:
   forming a preliminary transistor stack comprising a first plurality of nanosheets and a second plurality of nanosheets on the first plurality of nanosheets;
   forming a recess in the preliminary transistor stack by removing a first portion of the second plurality of nanosheets;
   forming a spacer in the recess; and
   forming a first tri-gate and a second tri-gate on the first plurality of nanosheets and the second plurality of nanosheets, respectively, after forming the spacer,
   wherein the spacer overlaps the first plurality of nanosheets and contacts a second portion of the second plurality of nanosheets that remains after removing the first portion.

7. The method of claim 6,
   wherein the preliminary transistor stack further comprises a sacrificial material that is on the first plurality of nanosheets and the second plurality of nanosheets,
   wherein removing the first portion of the second plurality of nanosheets comprises removing a first portion of the sacrificial material, and
   wherein forming the first tri-gate and the second tri-gate comprises replacing with a metal gate material:
      a second portion of the sacrificial material that remains on the first plurality of nanosheets and the second plurality of nanosheets after removing the first portion of the sacrificial material; and
      an insulating material that is on the first plurality of nanosheets and the second plurality of nanosheets and that has an etch selectivity with respect to the spacer.

8. The method of claim 7, wherein forming the spacer comprises forming the spacer on a sidewall of the sacrificial material, a sidewall of the first plurality of nanosheets, and a sidewall of the second plurality of nanosheets.

* * * * *